(12) United States Patent
Matsuoka

(10) Patent No.: US 8,013,362 B2
(45) Date of Patent: Sep. 6, 2011

(54) SEMICONDUCTOR INTEGRATED CIRCUIT AND MULTI-CHIP MODULE

(75) Inventor: Daisuke Matsuoka, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/966,418

(22) Filed: Dec. 13, 2010

(65) Prior Publication Data

US 2011/0079928 A1 Apr. 7, 2011

Related U.S. Application Data

(63) Continuation of application No. 11/979,769, filed on Nov. 8, 2007, now Pat. No. 7,872,283.

(30) Foreign Application Priority Data

Nov. 9, 2006 (JP) .................................. 2006-303969
Sep. 27, 2007 (JP) .................................. 2007-251607

(51) Int. Cl.
H01L 23/50 (2006.01)

(52) U.S. Cl. ........ 257/203; 257/766; 257/207; 257/211; 257/758; 257/691; 257/48; 257/E23

(58) Field of Classification Search .................. 257/200, 257/207, 211, 691, 786, E23, 758, 203
See application file for complete search history.

(56) References Cited

U.S. PATENT DOCUMENTS

| | | | |
|---|---|---|---|
| 6,222,213 B1 | 4/2001 | Fujiwara | |
| 6,411,485 B1 * | 6/2002 | Chen et al. | 361/111 |
| 6,798,069 B1 | 9/2004 | Ali et al. | |
| 7,872,283 B2 * | 1/2011 | Matsuoka | 257/203 |
| 2004/0036141 A1 | 2/2004 | Rakshani | |
| 2005/0122646 A1 | 6/2005 | Okushima | |
| 2005/0127405 A1 * | 6/2005 | Chen et al. | 257/203 |
| 2006/0175698 A1 * | 8/2006 | Watanabe et al. | 257/691 |
| 2006/0175714 A1 | 8/2006 | Ohnishi et al. | |

FOREIGN PATENT DOCUMENTS

| | | |
|---|---|---|
| CN | 1489210 A | 4/2004 |
| JP | 09-045723 | 2/1997 |

OTHER PUBLICATIONS

Chinese Office Action, with English translation thereof, issued in Chinese Patent Application No. 200710165891.6, dated Apr. 13, 2010.

* cited by examiner

*Primary Examiner* — Wael Fahmy
*Assistant Examiner* — Marc Armand
(74) *Attorney, Agent, or Firm* — McDermott Will & Emery LLP

(57) ABSTRACT

In a semiconductor integrated circuit requiring a large number of pads, an internal circuit is arranged in the center portion, and a plurality of two kinds of I/O circuits for inputting and outputting signals from and to the outside and many pads are arranged along four sides of the semiconductor integrated circuit. The plurality of I/O circuits that are of one of the foregoing two kinds are one-pad I/O circuits on which one pad is arranged in a direction toward the internal circuit, whereas the plurality of I/O circuits that are of the other of the foregoing two kinds are two-pad I/O circuits on which two pads are arranged in zigzag relationship in a direction toward the internal circuit. The number of arranged pads equals to the number of pads required for the semiconductor integrated circuit. The one-pad I/O circuits and the two-pad I/O circuits are provided with power source wirings for supplying power thereto. The power source wirings extend along the arrangement direction of the one-pad I/O circuits and the second-pad I/O circuits to be ring-shaped. power source wiring migration areas for changing power source wirings between the one-pad I/O circuits and second-pad I/O circuits are disposed in four corner portions of the semiconductor integrated circuit.

20 Claims, 29 Drawing Sheets

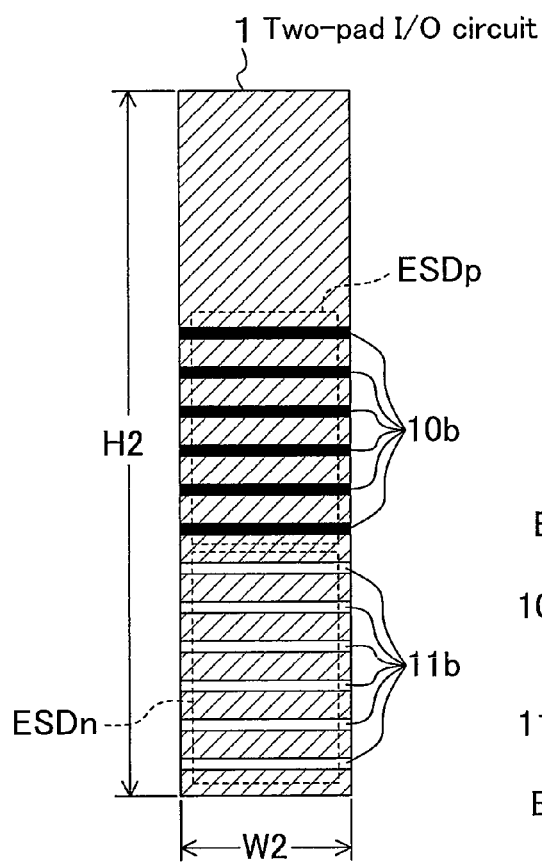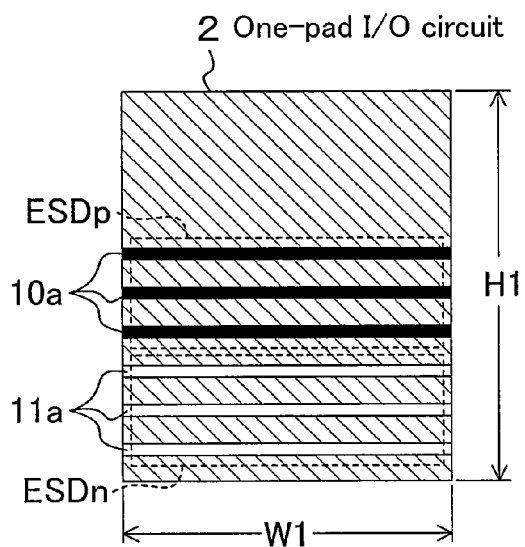

1 Two-pad I/O circuit

10b

11b

2 One-pad I/O circuit

10a

11a

1 Two-pad I/O circuit

2 One-pad I/O circuit

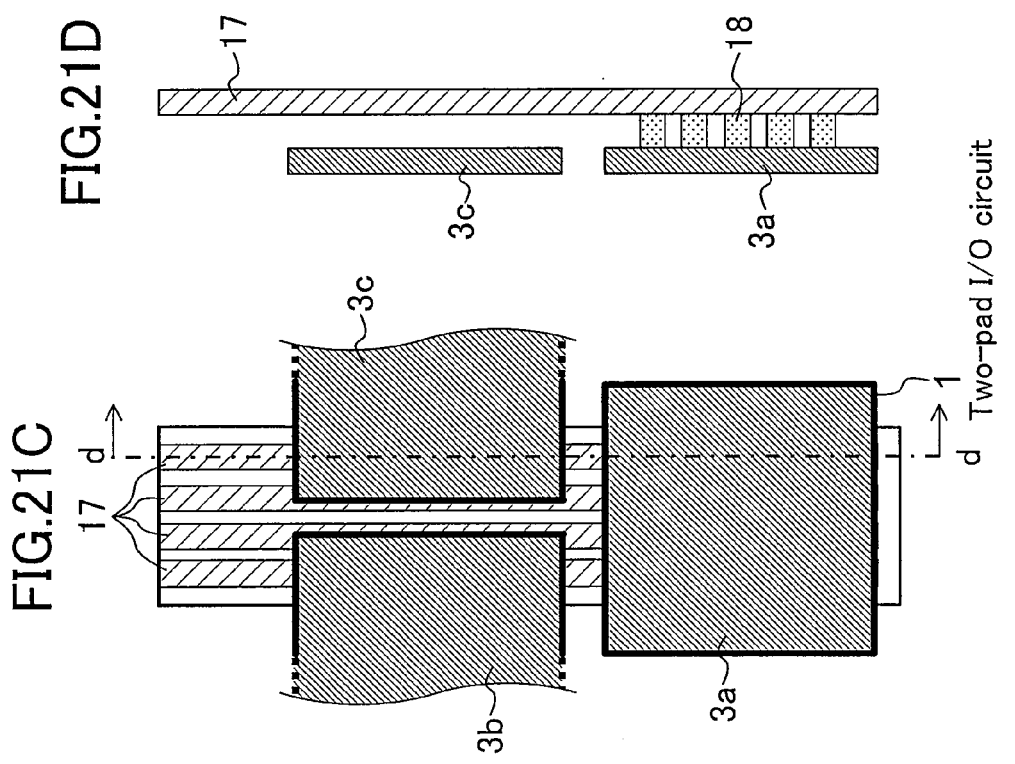

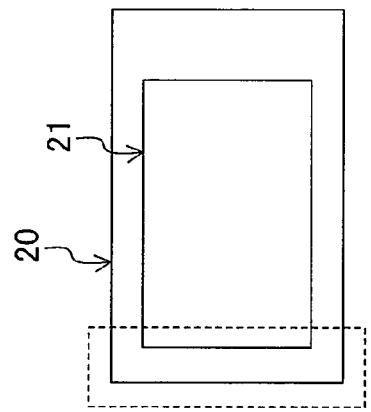
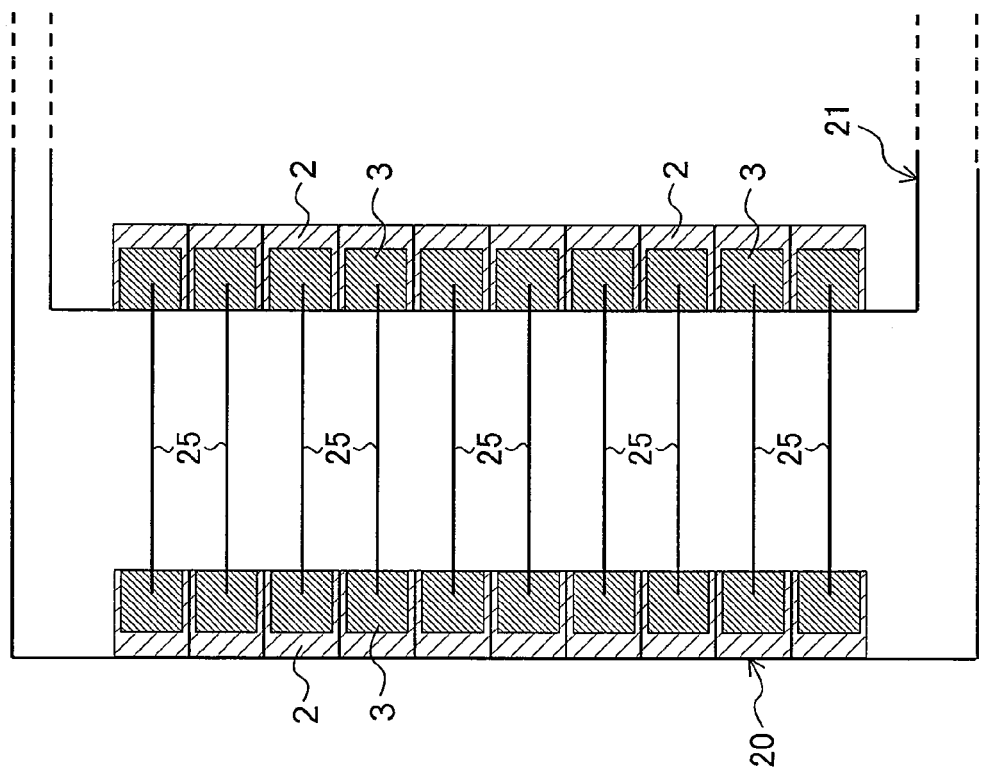

SEMICONDUCTOR INTEGRATED CIRCUIT AND MULTI-CHIP MODULE

CROSS REFERENCE TO RELATED APPLICATIONS

This non-provisional application is a Continuation of U.S. patent application Ser. No. 11/979,769, filed on Nov. 8, 2007, now U.S. Pat. No. 7,872,283 and claims priority under 35 U.S.C. §119(a) on Patent Application No. 2006-303969 filed in Japan on Nov. 9, 2006 and Patent Application No. 2007-251607 filed in Japan on Sep. 27, 2007, the entire contents of which are hereby incorporated by reference.

BACKGROUND OF THE INVENTION

The present invention relates to a semiconductor integrated circuit on the periphery of which input/output (I/O) circuits and pads, which are interfaces with the outside, are arranged, and more particularly, the invention relates to a semiconductor integrated circuit in which the number of pads is large for the size of the internal circuit.

Conventionally, in a semiconductor integrated circuit, which is a semiconductor chip, a plurality of I/O circuits 1 and pads 2 have been arranged side by side in one row on the periphery outside an internal circuit 3 as shown in FIG. 24.

In recent years, in accordance with the progress in miniaturization of process technology, it becomes possible that more functions than those conventionally achievable are integrated into one semiconductor integrated circuit. The number of I/O circuits placed as interfaces with the outside and the number of pads are increasing. However, the area reduction effect caused by miniaturization differs between low withstand voltage transistors for use in memory circuits, logic circuits, and the like and high withstand voltage transistors for use in analog circuits, I/O circuits, and the like. Compared to memory circuits and logic circuits the areas of which have been significantly reduced by miniaturization of manufacturing processes, analog circuits and I/O circuits have areas that have not significantly been reduced. As a result of such imbalance in area reduction effect, the ratio of the area of analog circuits and I/O circuits to the total area is increasing. For example, as shown in FIG. 25, I/O circuits and pads the numbers of which are determined by the needs of a semiconductor integrated circuit are arranged on the outer periphery of the internal circuit 3 including a memory circuit, a logic circuit, and the like. In this case, an outer peripheral frame formed of the arranged I/O circuits 1 and pads 2 is large compared to the internal circuit 3. As a result, there occurs a wide space between the internal circuit 3 and the I/O circuits and the pads 2. This means occurrence of a waste region. Thus, there has been a drawback that area reduction cannot be achieved although miniaturization progresses in manufacturing processes.

In view of this, conventionally, for example as shown in FIG. 26, there has been proposed a pad arranging method of arranging pads in two rows to achieve good balance between the area of the internal circuit 3 and the area of the outer peripheral frame formed of the arranged I/O circuits 1 and pads 2. With this method, the area of the semiconductor integrated circuit is effectively reduced even though many pads are arranged, as compared to the case of arranging pads in one row. This proposal is disclosed in, e.g., Japanese Unexamined Patent Application Publication No. 9-45723.

In the case where pads are arranged in two rows as mentioned above, the width and height of an I/O circuit for two pads are set in accordance with sizes and arrangement pitches of a plurality of pads to be arranged. In a plurality of I/O circuits arranged on the outer periphery, power source wirings extending in a direction of arrangement of the I/O circuits are formed inside each I/O circuit in order to supply the power to the I/O circuit. When the I/O circuits are arranged neighboring each other, the inside power source wirings are connected to each other such that the connected wirings are typically ring-shaped. Therefore, the I/O circuit for two pads, similarly to the I/O circuit for one pad, is formed in a shape with the width and the height each limited to one kind.

Under such limitation, in the foregoing conventional semiconductor integrated circuit having pads arranged in two rows, pads are arranged in two rows over the entire periphery even when the number of pads required for the semiconductor IC is not so large enough to form two pads in all the sides of the semiconductor integrated circuit. This therefore causes excess pads that are not used for input or output of signals. Such excess pads have conventionally been used to enhance power sources for the purpose of reduction in IR drop, with the power sources assigned to the excess pads.

In the foregoing conventional semiconductor integrated circuit having pads arranged in two rows, the area can be reduced compared to a semiconductor integrated circuit having pads arranged in one row as shown in FIG. 25. However, it has been found that the effect of area reduction is low. For example, in the semiconductor integrated circuit having pads arranged in two rows, if five pads are excessive, the area of the semiconductor integrated circuit is larger than that of a semiconductor integrated circuit without the five excessive pads 2 by the area required for arranging the five excessive pads 2 as indicated by a dotted line in FIG. 26.

SUMMARY OF THE INVENTION

It is an object of the present invention to further enhance the effect of area reduction by reducing the number of excess pads in a semiconductor integrated circuit in which pads are arranged in a plurality of rows on the outer periphery.

To achieve the foregoing object, in the present invention, I/O circuits are not limited to one kind, and two kinds of I/O circuit among I/O circuits for one pad and I/O circuits for a plurality of pads are used to control the number of pads.

In using at least two kinds of I/O circuits, if two I/O circuits that differ from each other in kind are arranged side by side, it is assumed that the internal power source wirings of both the I/O circuits might fail to be satisfactorily connected to each other. An area for satisfactorily connecting the power source wirings between both the I/O circuits needs to be arranged. By devising arrangement of this area, the effect of area reduction is prevented from lowering.

That is, a semiconductor integrated circuit of the present invention includes an internal circuit, and a plurality of I/O circuits that are arranged side by side outside the internal circuit, that output a signal of the internal circuit to outside or input a signal of outside to the internal circuit, and on which pads are arrangeable, the plurality of I/O circuits including an n-pad I/O circuit on which the n-pads (n being an integer equal to or larger than one) are arranged in a direction toward the internal circuit, and an m-pad I/O circuit on which the m-pads (m being an integer larger than n) are arranged in a direction toward the internal circuit.

Regarding one embodiment of the invention, in the semiconductor integrated circuit, each of the n-pad I/O circuit and the m-pad I/O circuit includes power source wirings extending in a direction of arrangement of the I/O circuits, and at least one of the power source wirings is positioned at a different height from an outer edge between the n-pad I/O circuit and the m-pad I/O circuit; and between the n-pad I/O circuit and the m-pad I/O circuit arranged side by side, a power source wiring migration area is formed in which power source wirings for connecting the power source wirings of the n-pad I/O circuit with the power source wirings of the m-pad I/O circuit are formed.

Regarding one embodiment of the invention, in the semiconductor integrated circuit, the n-pad I/O circuit and the m-pad I/O circuit are positioned in ends of two sides that form a corner portion of the semiconductor integrated circuit; and the power source wiring migration area is formed in the corner portion.

Regarding one embodiment of the invention, in the semiconductor integrated circuit, each of the n-pad I/O circuit and the m-pad I/O circuit includes power source wirings extending in a direction of arrangement of the I/O circuits, and at least one of the power source wirings is positioned at a different height from an outer edge between the n-pad I/O circuit and the m-pad I/O circuit; and the n-pad I/O circuit and the m-pad I/O circuit arranged side by side adjacent to each other are positioned apart from each other by a predetermined distance.

Regarding one embodiment of the invention, in the semiconductor integrated circuit, each of the n-pad I/O circuit and the m-pad I/O circuit includes power source wirings extending in a direction of arrangement of the I/O circuits, and at least one of the power source wirings is positioned at a different height from an outer edge between the n-pad I/O circuit and the m-pad I/O circuit; and a protection circuit for electrostatic discharge protection is arranged between the n-pad I/O circuit and the m-pad I/O circuit arranged side by side adjacent to each other.

Regarding one embodiment of the invention, in the semiconductor integrated circuit, the power source wirings included in the n-pad I/O circuit and the power source wirings included in the m-pad I/O circuit differ from each other in number.

Regarding one embodiment of the invention, in the semiconductor integrated circuit, the power source wirings included in the n-pad I/O circuit and the power source wirings included in the m-pad I/O circuit differ from each other in wiring width.

Regarding one embodiment of the invention, in the semiconductor integrated circuit, a wiring layer in which the power source wirings included in the n-pad I/O circuit are formed and a wiring layer in which the power source wirings included in the m-pad I/O circuit are formed differ from each other.

Regarding one embodiment of the invention, in the semiconductor integrated circuit, a wiring layer in which the power source wirings included in the n-pad I/O circuit are formed and a wiring layer in which the power source wirings included in the m-pad I/O circuit are formed differ from each other in number.

Regarding one embodiment of the invention, in the semiconductor integrated circuit, the semiconductor integrated circuit is a rectangle having four sides; the same kind of I/O circuits, which are either the n-pad I/O circuits or the m-pad I/O circuits, are arranged along one pair of sides of two pairs of sides facing each other; and I/O circuits different in pad number from either the n-pad I/O circuits or the m-pad I/O circuits arranged along the one pair of sides are arranged along one side of another pair of sides.

Regarding one embodiment of the invention, in the semiconductor integrated circuit, a plurality of n-pad I/O circuits are arranged side by side along one side of the semiconductor integrated circuit; and an arrangement pitch of the plurality of n-pad I/O circuits arranged side by side along the one side is set in consideration of an arrangement pitch of a plurality of I/O circuits arranged along one side of another semiconductor integrated circuit.

A multi-chip module of the present invention includes a semiconductor chip constituting the semiconductor integrated circuit, and a semiconductor chip constituting another semiconductor integrated circuit, wherein the plurality of n-pad I/O circuits arranged along the one side of the semiconductor integrated circuit and a plurality of I/O circuits arranged along one side of the another semiconductor integrated circuit face each other and are connected by a chip-to-chip interconnect.

Regarding one embodiment of the invention, in the semiconductor integrated circuit, a plurality of n-pad I/O circuits and a plurality of m-pad I/O circuits are arranged side by side. On an entirety of the plurality of n-pad I/O circuits and the plurality of m-pad I/O circuits, a multiplicity of pads arranged in the plurality of n-pad I/O circuits are arranged in zigzag relationship, and a multiplicity of pads arranged in the plurality of m-pad I/O circuits are arranged in zigzag relationship.

Regarding one embodiment of the invention, in the semiconductor integrated circuit, on an entirety of the included n-pad I/O circuits and the m-pad I/O circuits, a total number of pads positioned in a predetermined row and a total number of pads positioned in a row numbered one more than the predetermined row differ from each other.

Regarding one embodiment of the invention, in the semiconductor integrated circuit, the n-pad I/O circuit and the m-pad I/O circuit differ from each other in width in an arrangement direction and a height in the direction toward the internal circuit.

Regarding one embodiment of the invention, in the semiconductor integrated circuit, total gate widths of transistors each having a drain connected directly to a pad are equal to each other between the n-pad I/O circuit and the m-pad I/O circuit.

Regarding one embodiment of the invention, in the semiconductor integrated circuit, in the n-pad I/O circuit and the m-pad I/O circuit, transistors of the same conductive type each having a drain connected directly to a pad are in multifinger structures, and gate widths are equal to each other between the multifinger structures.

Regarding one embodiment of the invention, in the semiconductor integrated circuit, gate lengths of transistors that realize the same function are equal to each other between the n-pad I/O circuit and the m-pad I/O circuit.

Regarding one embodiment of the invention, in the semiconductor integrated circuit, gate widths of transistors that realize the same function are equal to each other between the n-pad I/O circuit and the m-pad I/O circuit.

Regarding one embodiment of the invention, in the semiconductor integrated circuit, a width of the n-pad I/O circuit in a direction of arrangement of the n-pad I/O circuits is larger than a width of the m-pad I/O circuit in a direction of arrangement of the m-pad I/O circuits; and a height in the direction toward the internal circuit of the n-pad I/O circuit is less than a height in the direction toward the internal circuit of the m-pad I/O circuit.

As described above, in the present invention, at least two kinds of I/O circuits that differ from each other in the number of pads arranged in a direction toward the internal circuit are used. Therefore, for example, if two-pad I/O circuits are arranged along the upper, lower, and left sides and one-pad I/O circuits are arranged along the right side in the conventional semiconductor integrated circuit of FIG. 26, a region on the right side of the dotted line shown in FIG. 26 can be reduced. This enables the area of the semiconductor integrated circuit to be further reduced.

Further, the data on I/O circuits can be reused as the library. That is, the area of the semiconductor integrated circuit has conventionally been reduced by specifically setting the number of pads arranged in a direction toward an internal circuit and the heights and widths of I/O circuits in accordance with the size of the internal circuit and the number of required pads. However, the I/O circuits are specific to this semiconductor integrated circuit, and therefore it is difficult to reuse the I/O circuits for a new semiconductor integrated circuit. On the other hand, in the present invention, the area of the semiconductor integrated circuit is reduced by combining n-pad I/O circuits with m-pad I/O circuits, and therefore the n-pad I/O circuits and the m-pad I/O circuits need not to be designed specific to a particular semiconductor integrated circuit. Thus, newly developed, various kinds of semiconductor integrated circuits can be accommodated only by combining existing n-pad I/O circuits and m-pad I/O circuits.

In particular, in the present invention, a power source wiring migration area is formed in a corner portion of a semiconductor integrated circuit, and therefore the corner portion can be effectively used and only many I/O circuits and pads can be arranged in portions other than the corner portion in each side of the semiconductor integrated circuit.

Also, in the present invention, two I/O circuits that differ from each other in the number of pads are positioned adjacent to each other in two sides forming a corner portion of the semiconductor integrated circuit. For example, if both the I/O circuits are ones for two pads, four pads are positioned densely in the vicinity of the corner portion, operations to connect these pads to pads of a semiconductor package by wires are difficult in packaging the semiconductor integrated circuit in the semiconductor package. On the other hand, for example, if a two-pad I/O circuit and a one-pad I/O circuit are positioned adjacent to each other according to the present invention, only three pads are positioned in the vicinity of the corner portion. This makes it relatively easy to connect pads by wires.

Further, in the present invention, the n-pad I/O circuit and the m-pad I/O circuit differ from each other in kind, and therefore the number and width of power source wirings arranged inside the I/O circuits or wiring layers in which the I/O circuits are disposed and the number thereof can be specifically set to differ from each other.

Additionally, in the present invention, in a multi-chip module including both a semiconductor chip having this semiconductor integrated circuit and a semiconductor chip having another semiconductor integrated circuit, one side of this semiconductor integrated circuit is arranged facing one side of the another semiconductor integrated circuit. When pads of a plurality of I/O circuits arranged along one side of this semiconductor integrated circuit are connected to those arranged along one side of the another semiconductor integrated circuit by wires, the lengths of wires for connecting pair of pads are equal to one another and short because arrangement pitches of I/O circuits of both the semiconductor integrated circuits are substantially equal to each other. Therefore, this not only improves the ease of assembling but also provides high-speed interface characteristics while suppressing variations of characteristics among pads for inputting and outputting different signals.

In the present invention, electrical characteristics of a plurality of kinds of I/O circuits that differ from one another in the number of pads are equal to one another. Therefore, if these I/O circuits are integrated in one semiconductor integrated circuit, it is not necessary to consider which kind of I/O circuit is to be assigned to each signal terminal of the semiconductor integrated circuit. This increases flexibility of arrangement of signal terminals.

BRIEF DESCRIPTION OF THE DRAWINGS

FIG. 3A shows a state of power source wirings in a one-pad I/O circuit included in the semiconductor integrated circuit of FIG. 1, and FIG. 3B shows a state of power source wirings in a two-pad I/O circuit included in the semiconductor integrated circuit.

FIG. 21A shows a layout of wirings to supply a potential to a pad of a one-pad I/O circuit in a semiconductor integrated circuit of the fourth embodiment of the present invention, FIG. 21B is a sectional view taken along the line b-b in FIG. 21A, FIG. 21C shows a layout of wirings to supply potential to a pad of a two-pad I/O circuit in this semiconductor integrated circuit, and FIG. 21D is a sectional view taken along the line d-d in FIG. 21C.

FIG. 22A shows a multi-chip module of a fifth embodiment of the present invention, and FIG. 22B is an enlarged view of a portion surrounded by dotted line in FIG. 22A.

DESCRIPTION OF THE PREFERRED EMBODIMENTS

Preferred embodiments will be described below with reference to the accompanying drawings.

First Embodiment

Figure 1:
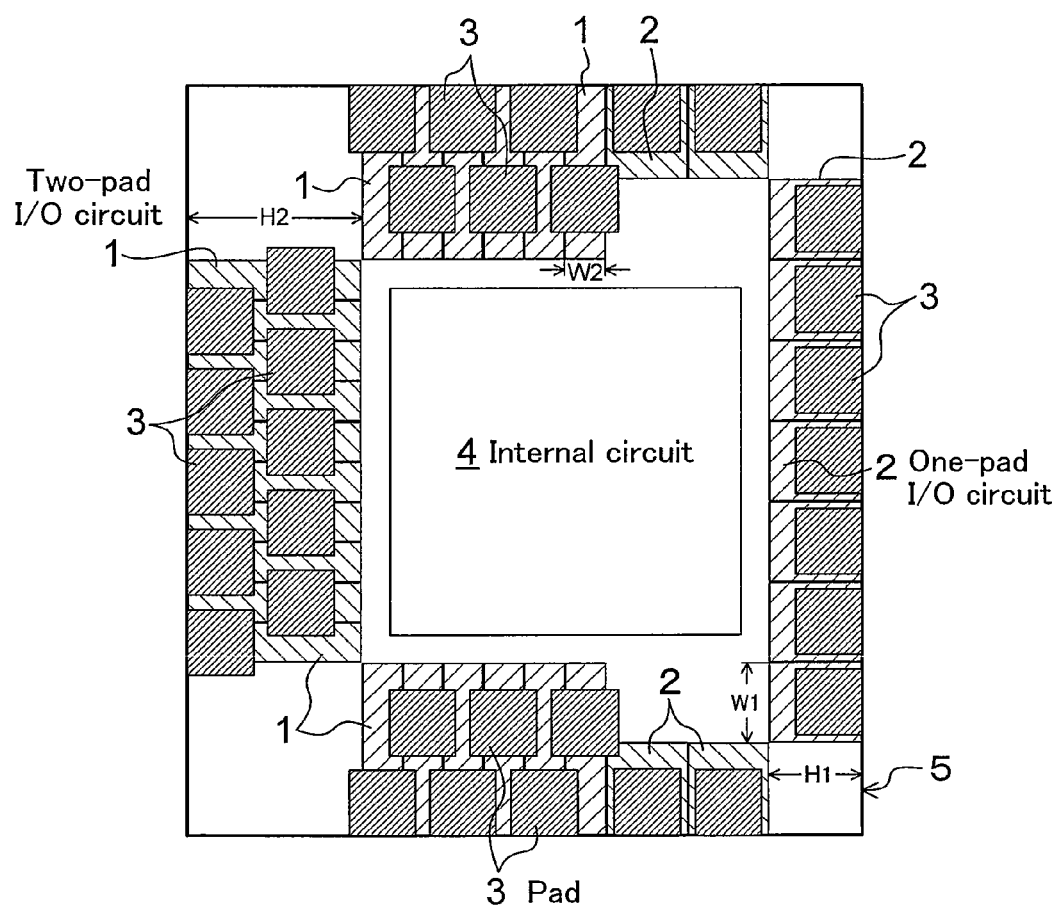
FIG. 1 is a conceptual view of a semiconductor integrated circuit of a first embodiment of the present invention.

FIG. 1 shows a semiconductor integrated circuit of this embodiment.

A semiconductor integrated circuit 5, which is a semiconductor chip in the figure, is rectangular in shape, and an internal circuit 4 is disposed in a center portion. Outside the internal circuit 4, pluralities of input/output (I/O) circuits 1 and 2 are disposed side by side along four sides of the outer periphery. These I/O circuits are components that output signals of the internal circuit 4 to the outside or input signals of the outside to the internal circuit 4, and on which one pad 3 or two pads 3 are arranged.

The pluralities of I/O circuits include two kinds of circuits. I/O circuits 1 are ones for m (m=2) pads, which allow two pads 3 to be arranged in a direction toward the internal circuit 4 mentioned above, and I/O circuits 2 are ones for n (n=1 (n<m)) pads, which allow one pad 3 to be arranged in a direction toward the internal circuit 4. On the plurality of I/O circuits 1 for two pads (hereinafter referred to as "two-pad I/O circuits 1") arranged, a plurality of pads 3 are displaced in a direction toward the internal circuit 4 and a direction of a side of the semiconductor integrated circuit 5 such that the plurality of pads 3 are arranged in zigzag relationship. The shape of the pad 3 arranged on the I/O circuit 2 for one pad (hereinafter referred to as "one-pad I/O circuit 2") is the same as that of the pad 3 on the two-pad I/O circuit 1. In the two-pad I/O circuit 1, since pads are arranged in zigzag relationship, the width W2 in a direction of arranging the two-pad I/O circuits side by side is set less than the width W1 of the one-pad I/O circuit 2, and the height H2 in a direction toward the internal circuit 4 is set higher than the height H1 of the one-pad I/O circuit 2. The total number of pads 3 in the first rows, which are arranged in outer positions, is 22 in the figure, and the total number of pads 3 in the secondary rows, which are arranged in inner positions, is 11. This shows the configuration in which the total number of pads 3 arranged in outer positions is larger.

Figure 2:
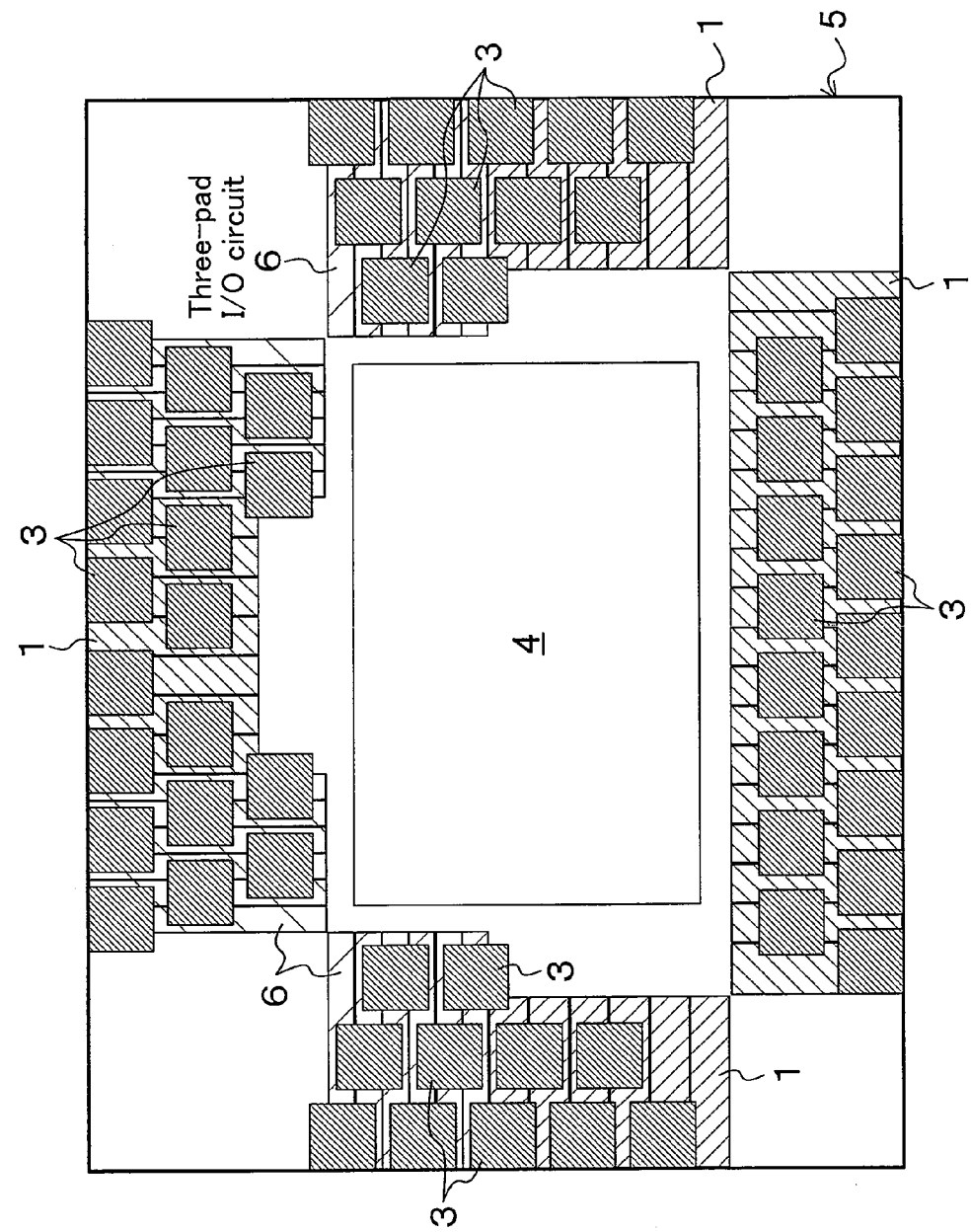
FIG. 2 shows a modification of the semiconductor integrated circuit of the embodiment.

FIG. 2 shows, by way of an example, another semiconductor integrated circuit of this embodiment. In the semiconductor integrated circuit 5 shown in FIG. 2, two kinds of I/O circuit, the two-pad I/O circuit 1 and I/O circuits 6 for three pads (hereinafter, referred to as "three-pad I/O circuits 6"), which differ from the kinds of I/O circuit in the semiconductor integrated circuit of FIG. 1.

Regarding the two-pad I/O circuit 1 and the three-pad I/O circuits 6, in which the number of pads is larger than one, the smaller the distance of a pad to the internal circuit 4 is, the larger the length of a wire for connecting the pad is in implementation of a semiconductor package. Therefore, the two-pad I/O circuit 1 and the three-pad I/O circuits 6 are assigned as low-speed interfaces, and the one-pad I/O circuit 2 is assigned as a high-speed interface.

It is noted that although a semiconductor integrated circuit having two kinds of I/O circuit is exemplified in FIGS. 1 and 2, three or more kinds of I/O circuit that differ in the number of pads from one another may of course be arranged in the present invention. Further, the number of pads for arranging pads 3 is not limited to one, two, and three.

Figure 26:
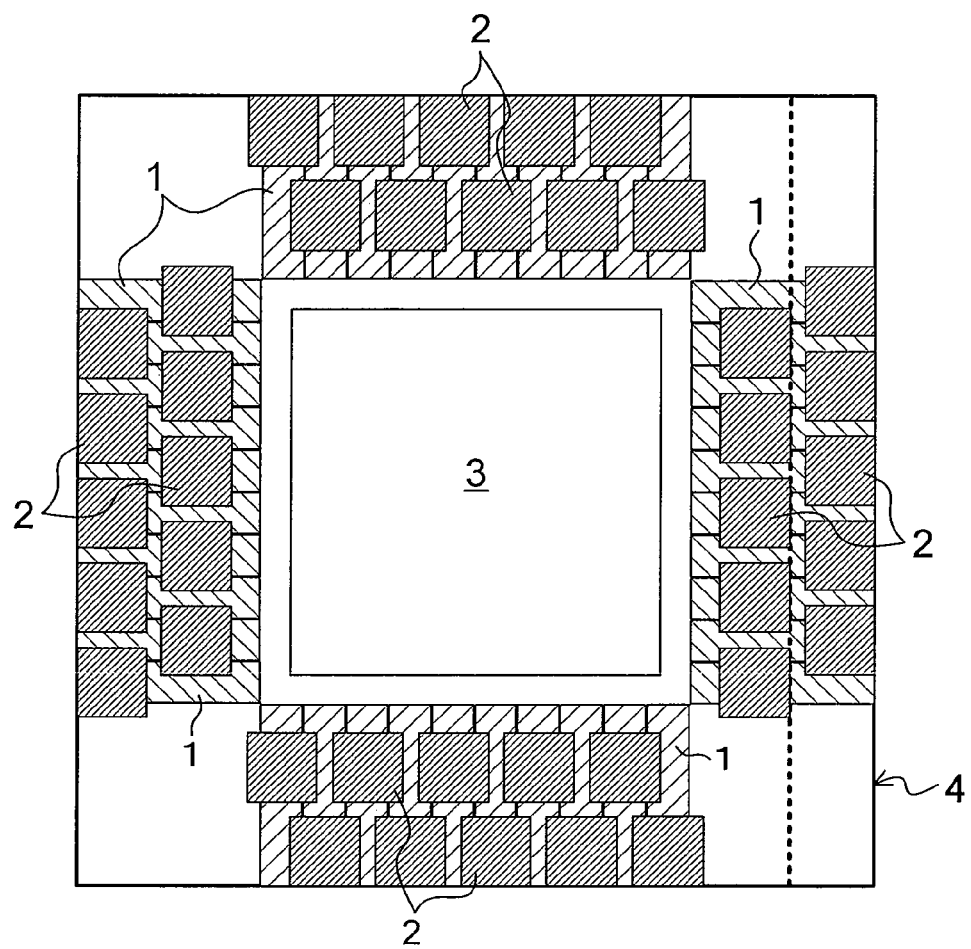
FIG. 26 shows a semiconductor integrated circuit that reduces a drawback in the case where the number of pads required for the semiconductor integrated circuit increases.

As described above, at least two kinds of I/O circuit 1, 2, and 6 that differ from one another in the number of pads are arranged in this embodiment. Therefore, as found, e.g., by comparing FIG. 1 with FIG. 26 showing a conventional semiconductor integrated circuit, the I/O circuits along the right side are ones for one pad in this embodiment in FIG. 1 whereas all the I/O circuits of the semiconductor integrated circuit are ones for two pads in the conventional configuration in FIG. 26, and therefore the area of a semiconductor integrated circuit can be reduced in this embodiment by the area corresponding to a region on the right side of the dotted line shown in FIG. 26.

FIGS. 3A and 3B show layouts of power source wirings (power trunk wirings) arranged in the one-pad I/O circuit 2 and the two-pad I/O circuit 1 included in the foregoing semiconductor integrated circuit in FIG. 1. The power source wirings are provided in the I/O circuit to supply power for the I/O circuit and disposed to be ring-shaped along four sides of the semiconductor integrated circuit. In the one-pad I/O circuit 2 shown in FIG. 3A, three VDD power source wirings 10a for a VDD of a predetermined voltage and three VSS power source wirings 11a for a ground voltage VSS are arranged extending in a direction of arranging the I/O circuits 2 side by side (horizontal direction in the figure). In the two-pad I/O circuit 1 shown in FIG. 3B, six VDD power source wirings 10b and six VSS power source wirings 11b are arranged extending in a direction of arranging the I/O circuits 1 side by side. In FIGS. 3A and 3B, ESDp means an ESDp protection area in which a large number of p channel transistors of unit capacity for electrostatic discharge (ESD) are arranged, and ESDn means an ESDn protection area in which a large number of n channel transistors of unit capacity for ESD are arranged. The areas of both protection areas are approximately the same. To make these ESD protection effective, the ESDp protection area ESDp is arranged underneath the foregoing VDD power source wirings 10a and 10b, and the ESDn protection area ESDn is arranged underneath the foregoing VSS power source wirings 11a and 11b. Because the width W1 of the one-pad I/O circuit 2 in FIG. 3A is wide and a width W2 of the two-pad I/O circuit 1 in FIG. 3B is narrow (W2<W1), the protection areas ESDp and ESDn in the two-pad I/O circuit 1 have shapes extending in the height direction, compared to the protection areas ESDp and ESDn in the one-pad I/O circuit 2. Accordingly, many power source wirings 10b and 11b are arranged in the height direction H2 in the two-pad I/O circuit 1. Six power source wirings 10b and six power source wirings 11b are set in the two-pad I/O circuit 1, whereas three power source wirings 10a and three power source wirings 11a are set in the one-pad I/O circuit 2. As a result, regarding the one-pad I/O circuit 2 and the two-pad I/O circuit 1, the height from the outer edge of the I/O circuit (the bottom edges in FIGS. 3A and 3B) varies between the VDD power source wirings 10a and 10b, and between the VSS power source wirings 11a and 11b. The two-pad I/O circuit 1 differs from the one-pad I/O circuit 2 in height in the power source wirings in this manner, and therefore if the one-pad I/O circuit 2 and the two-pad I/O circuit 1 are adjacent to each other, a need arises to provide a power source wiring migration area for connecting the power source wirings of both I/O circuits.

Figure 4:
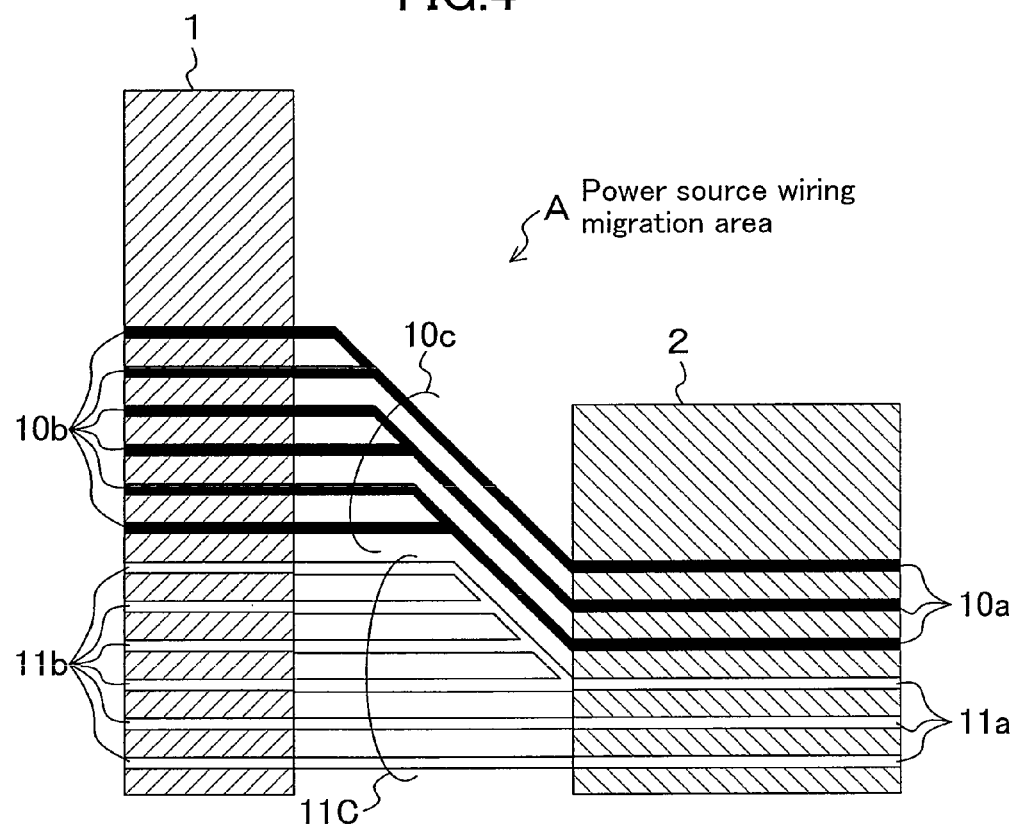
FIG. 4 shows a power source wiring migration area provided in this semiconductor integrated circuit.

FIG. 4 shows such a power source wiring migration area. In the figure, a space is provided between the one-pad I/O circuit 2 and the two-pad I/O circuit 1 adjacent to each other, and a power source wiring migration area A is provided that includes the VDD power source wirings 10c for migration to connect the VDD power source wirings 10a and 10b with each other and the VDD power source wirings 11e for migration to connect the VSS power source wirings 11a and 11b with each other.

Figure 5:
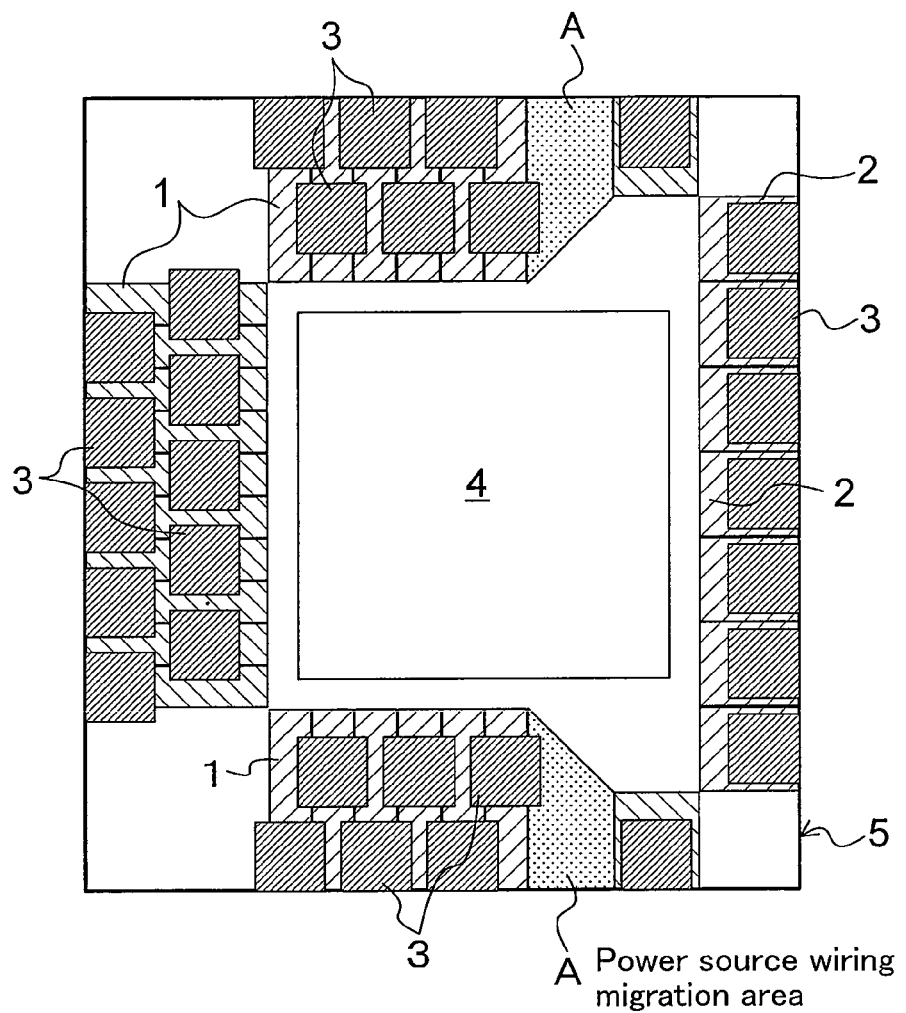
FIG. 5 shows a semiconductor integrated circuit provided with the foregoing power source wiring migration area.

FIG. 5 shows one example of a semiconductor integrated circuit in which the foregoing power source wiring migration areas A are provided. In the figure, the power source wiring migration area A is disposed in the middle of each of two sides of the semiconductor integrated circuit 5.

Figure 6:
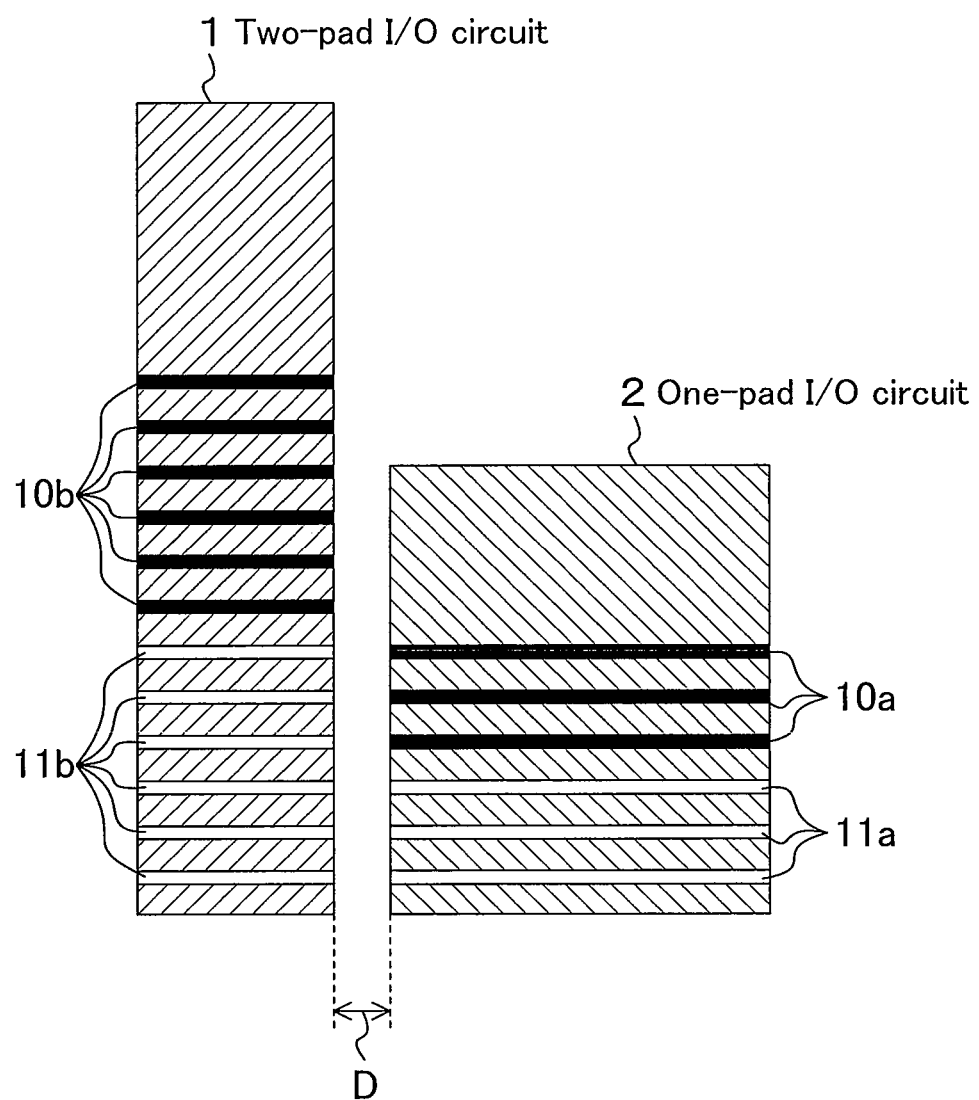
FIG. 6 shows a layout of arranging a one-pad I/O circuit and a two-pad I/O circuit spaced at a predetermined distance if power source wirings of I/O circuits of this semiconductor integrated circuit are not ring-shaped.
Figure 7:
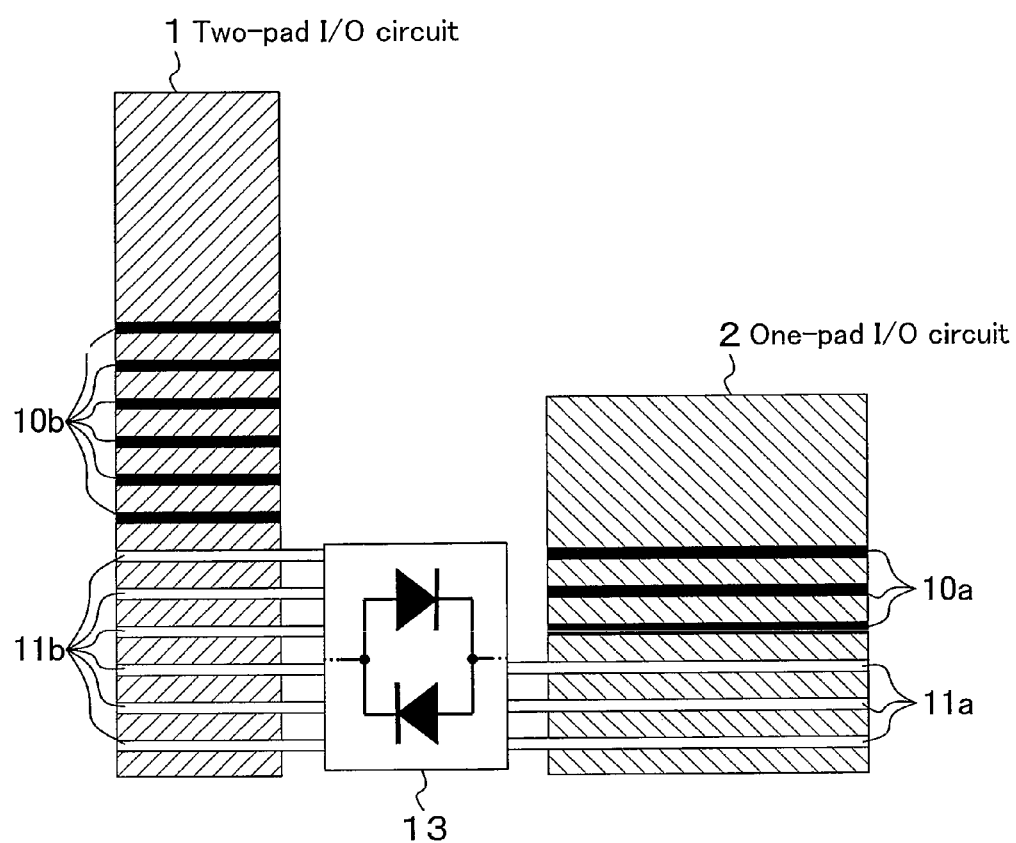
FIG. 7 shows arrangement of an ESD protection circuit between a one-pad I/O circuit and a two-pad I/O circuit if power source wirings of I/O circuits of this semiconductor integrated circuit are not ring-shaped.

It is noted that if the power source wirings for I/O circuits need not to be arranged to be ring-shaped, the one-pad I/O circuit 2 and the two-pad I/O circuit 1 may be arranged apart from each other by a predetermined distance D as shown in FIG. 6. The predetermined distance D is a distance that satisfies the design rules in manufacturing processes of a semiconductor integrated circuit. As shown in FIG. 7, the VSS power source wirings 11a of the one-pad I/O circuit 2 and the VSS power source wirings 11b of the two-pad I/O circuit 1 may be connected by an ESD protection circuit 13 using a diode element to ensure the ESD withstand voltage. In this case, the VDD power source wirings 10a and 10b are not connected with each other.

Second Embodiment

Next, a second embodiment of the present invention will be described.

Figure 8:
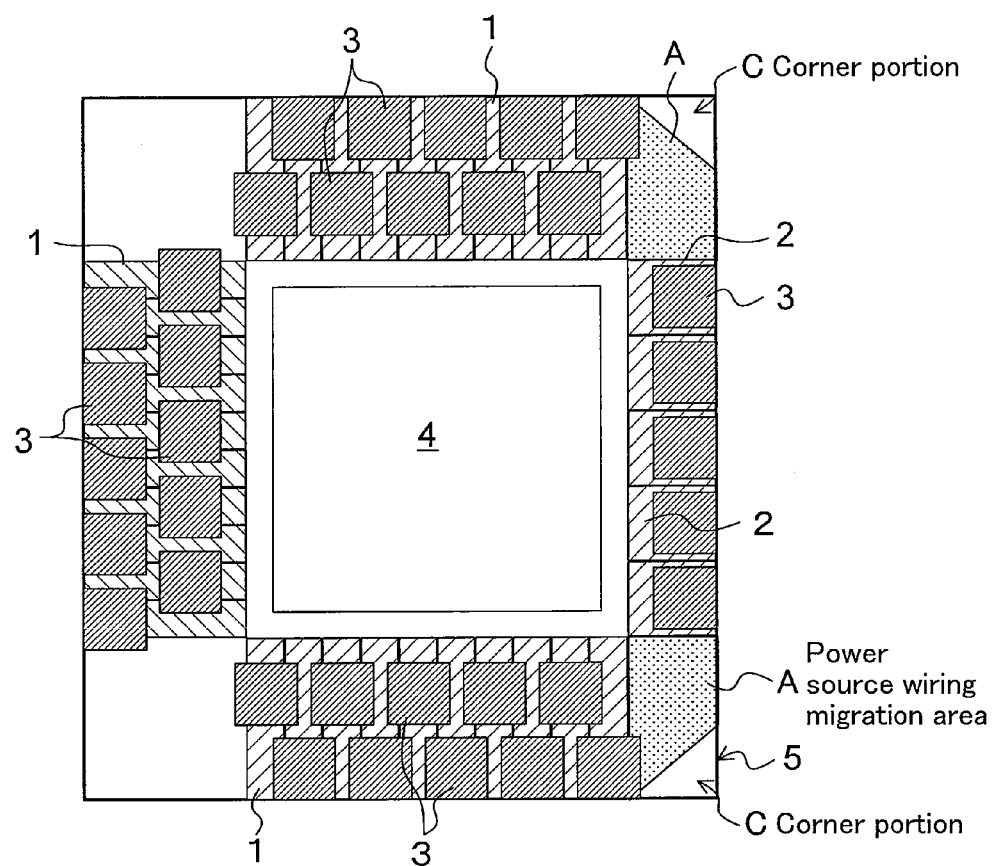
FIG. 8 shows a semiconductor integrated circuit of a second embodiment of the present invention.
Figure 9:
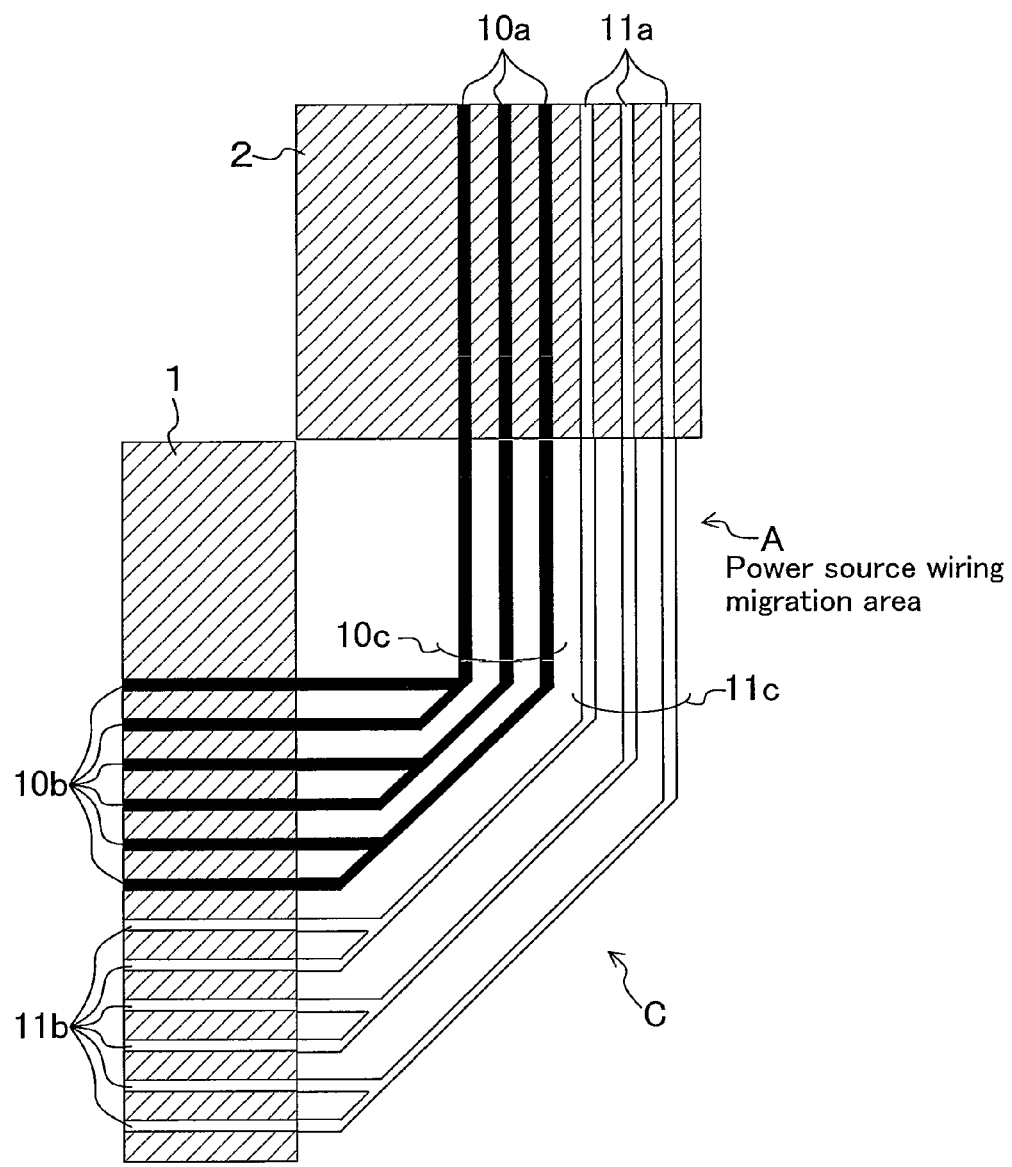
FIG. 9 shows a layout of power source wirings in a power source wiring migration area provided in this semiconductor integrated circuit.

FIG. 8 shows a semiconductor integrated circuit of this embodiment. In the semiconductor integrated circuit, two-pad I/O circuits 1 are arranged along the upper side, the lower side, and the left side, and the one-pad I/O circuit 2 is arranged along the right side. In two corner portions C at the lower right and at the upper right of the semiconductor integrated circuit 5, the power source wiring migration areas A for switching the power source wirings between the one-pad I/O circuit 2 and the two-pad I/O circuit 1 are disposed. In other words, this embodiment employs the configuration where the same kind of I/O circuits are arranged in each side of the semiconductor integrated circuit 5, and therefore the kind of I/O circuits is not changed, from the one-pad I/O circuits to the two-pad I/O circuits or from the two-pad I/O circuits to the one-pad I/O circuits, throughout one side, so that the number of pads for arranging pads is changed in the corner portions. The internal configuration of the power source wiring migration area A is as shown in FIG. 9, where the power source wiring migration area A arranged in the corner portion C at the lower right is exemplified.

Arranging the power source wiring migration areas A in the corner portion C in this way causes the following effects. That is, the shape of the power source wiring migration area A is not four-sided because the internal power source wirings 10c and 11c have portions extending in an oblique direction as shown in FIG. 4. Therefore, if the power source wiring migration area A is disposed in the middle of one side of the semiconductor integrated circuit 5 as shown in FIG. 5 of the first embodiment, an area for arranging the internal circuit 4 has a complicated shape, not a four-sided shape, as found from FIG. 5. Therefore, arrangement and wiring processes of signal wirings for the internal circuit 4 become complicated such that an area projecting from a rectangle shape might be a waste area. In this embodiment, on the other hand, it is possible to keep an area for arranging the internal circuit 4 rectangular as shown in FIG. 8. In this embodiment, attention is directed to the point that the corner portion of the semiconductor integrated circuit has only been used for placing marks and the like required for connection and assembling of a power trunk line, and thus the corner portion is effectively utilized.

Figure 10:
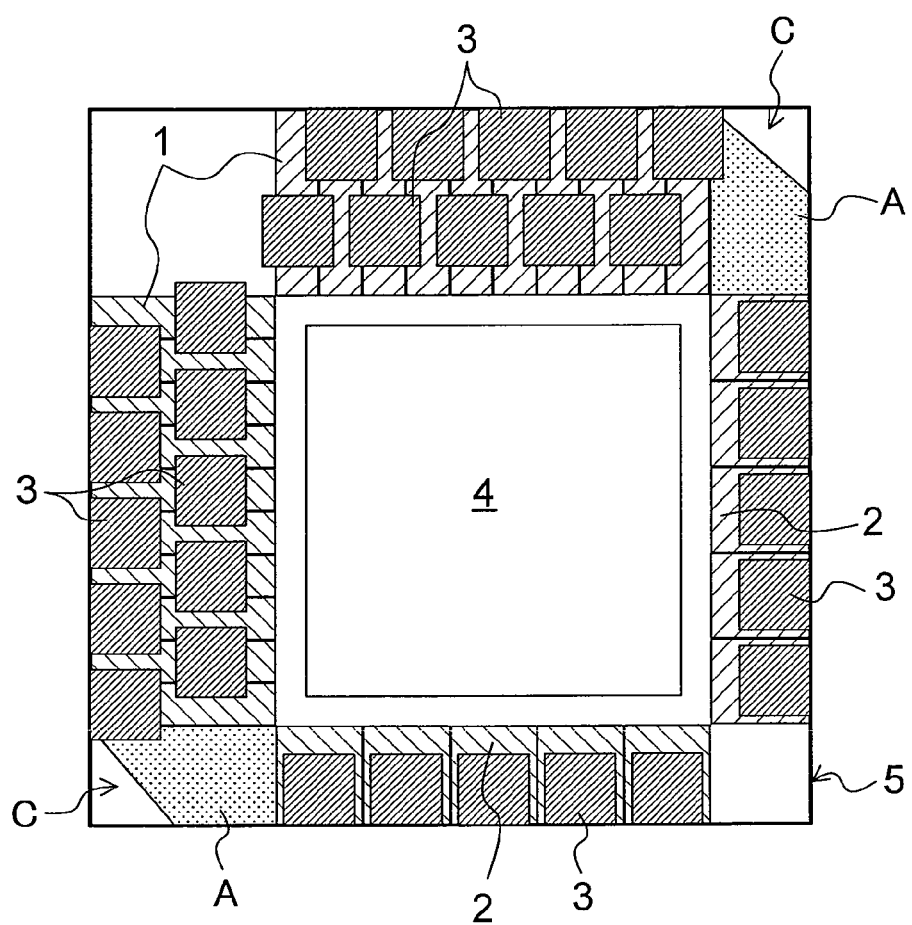
FIG. 10 shows a modification of this semiconductor integrated circuit.

FIG. 10 shows a modification of this embodiment. In the modification, the one-pad I/O circuit 2, instead of the two-pad I/O circuit 1 in FIG. 8 mentioned above, is arranged along the lower side of the semiconductor integrated circuit. With this change, the power source wiring migration area A is arranged in the corner portion C at the lower left, not in the corner portion C at the lower right.

Figure 11:
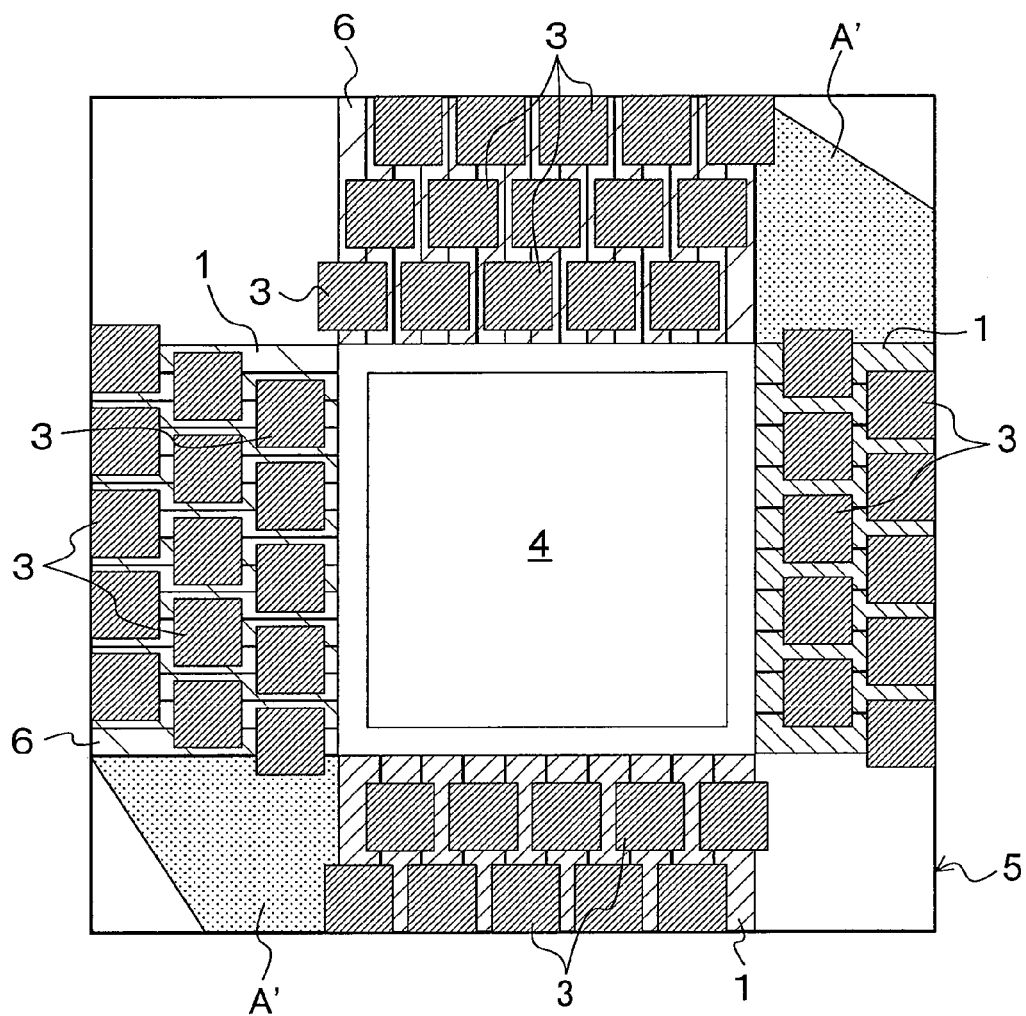
FIG. 11 shows another modification of the semiconductor integrated circuit of this embodiment.

FIG. 11 shows another modification. In the figure, the two-pad I/O circuits 1 are arranged along the right side and the lower side, and the three-pad I/O circuits 6 are arranged along the upper side and the left side. Accordingly, power source wiring migration areas A' are arranged in both corner portions at the upper right and at the lower left.

Third Embodiment

Subsequently, a third embodiment of the present invention will be described.

Figure 12:
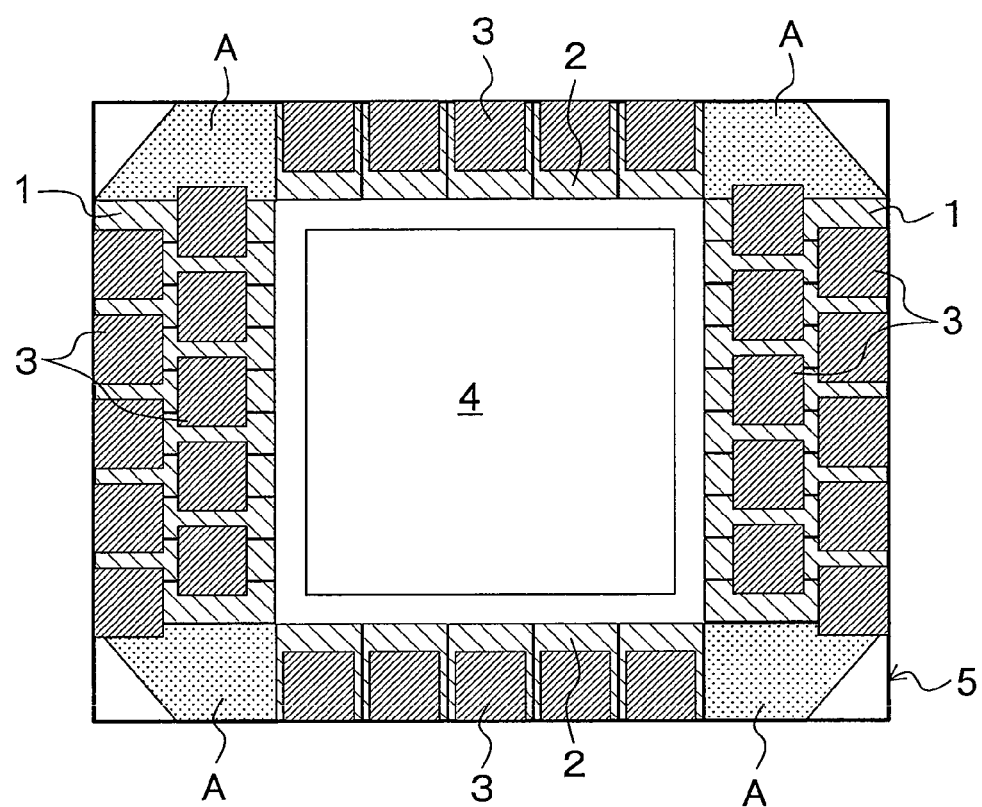
FIG. 12 shows a semiconductor integrated circuit of a third embodiment of the present invention.
Figure 13:
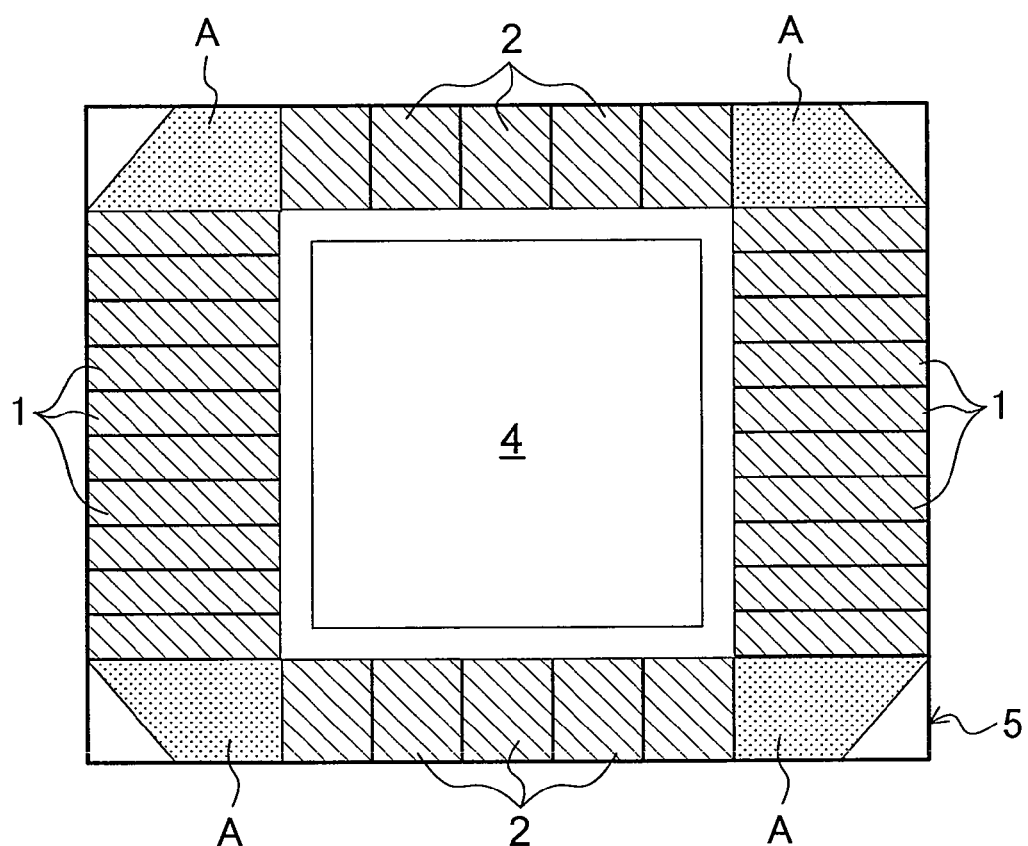
FIG. 13 is a view in which the pads are removed from the configuration of the semiconductor integrated circuit of FIG. 12.

FIG. 12 shows a semiconductor integrated circuit of this embodiment. FIG. 13 is a view in which the pads 3 are removed from the semiconductor integrated circuit of FIG. 12. In this embodiment, the ease of connection of wires in implementing this semiconductor integrated circuit in a semiconductor package is considered.

In the semiconductor integrated circuit 5 in FIG. 13, the one-pad I/O circuits 2 are arranged side by side along the two sides facing each other, the upper side and the lower side, and the two-pad I/O circuits 1 are arranged side by side along the two sides facing each other, the left side and the right side. Accordingly, the power source wiring migration areas A are arranged in all four corner portions. In other words, the one-pad I/O circuit 2 is adjacent to the two-pad I/O circuit 1, and the two-pad I/O circuits 1 are never adjacent to each other, in each corner portion.

Therefore, in this embodiment, since the one-pad I/O circuit 2 are adjacent to the two-pad I/O circuit 1 near each corner portion, the density of placement of pads 3 near the corner portion is low compared to the case where the two-pad I/O circuits 1 are adjacent to each other. Thus, in connecting each pad in the corner portions to each pin of a semiconductor package with a wire for implementation and in pressing a probe needle against each pad in wafer inspection, it is possible to excellently and easily carry out the operations. In general, as the density of placement of pads in the corner portion increases, wirings are elongated in a semiconductor package. As a result, the length of wirings increases, and it becomes difficult to make the lengths of wirings equal. These cause deterioration in propagation characteristics of signals. Such a defect can be reduced in this embodiment.

Figure 14:
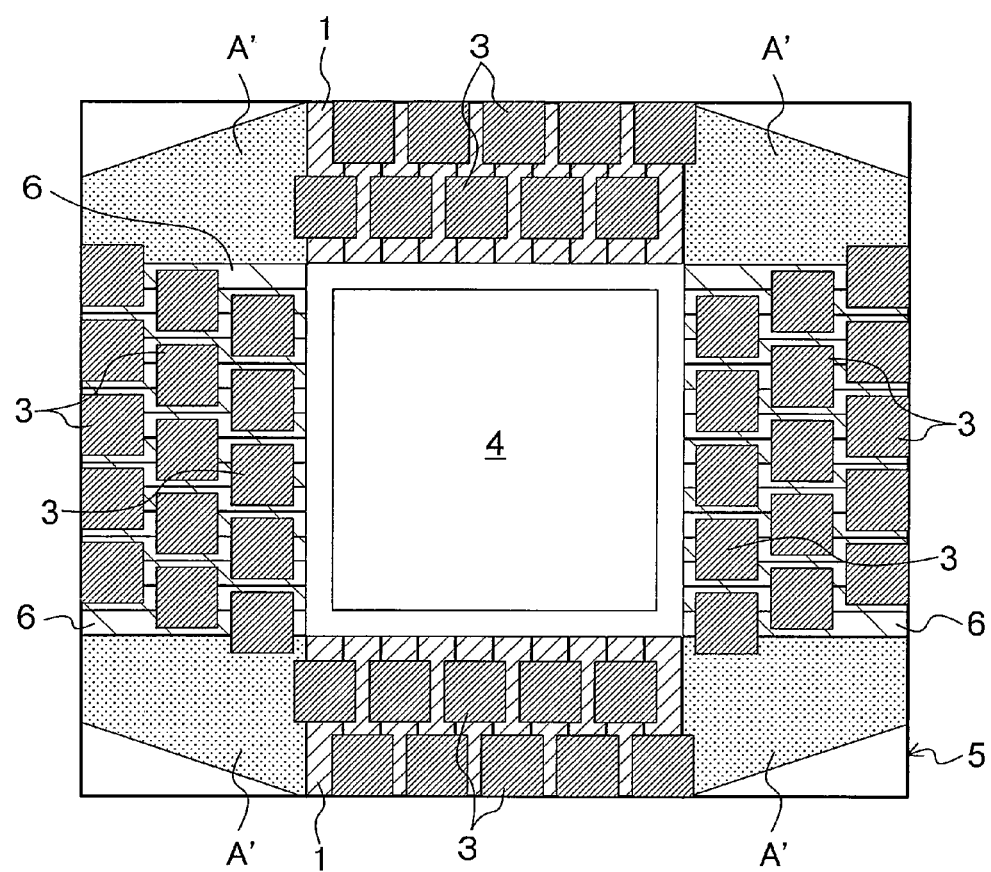
FIG. 14 shows a first modification of this semiconductor integrated circuit.
Figure 15:
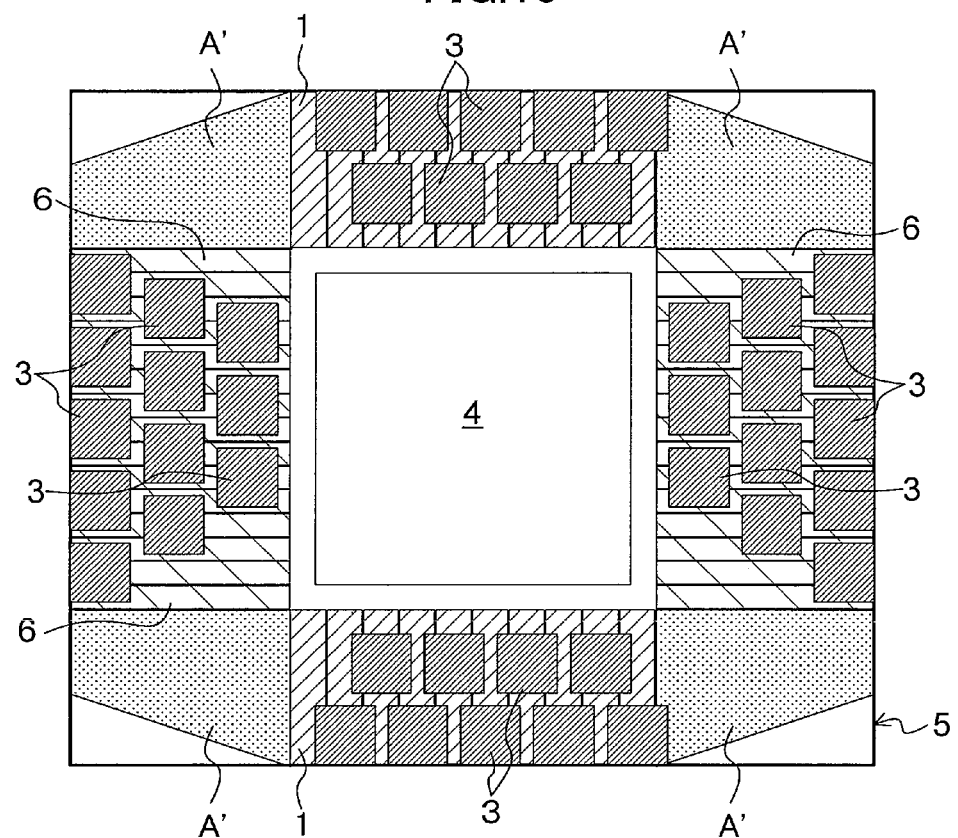
FIG. 15 shows a second modification of this semiconductor integrated circuit.

FIG. 14 shows a modification of the semiconductor integrated circuit in FIG. 12. In FIG. 14, the two-pad I/O circuit 1 are arranged side by side along the two sides facing each other, the upper side and the lower side, and the three-pad I/O circuits 6 are arranged side by side along the two sides facing each other, the left side and the right side. FIG. 15 shows a semiconductor integrated circuit in which some of the pads 3 arranged near the corner portion in the semiconductor integrated circuit of FIG. 14 are eliminated and the density of placement of pads 3 is further reduced.

Figure 16:
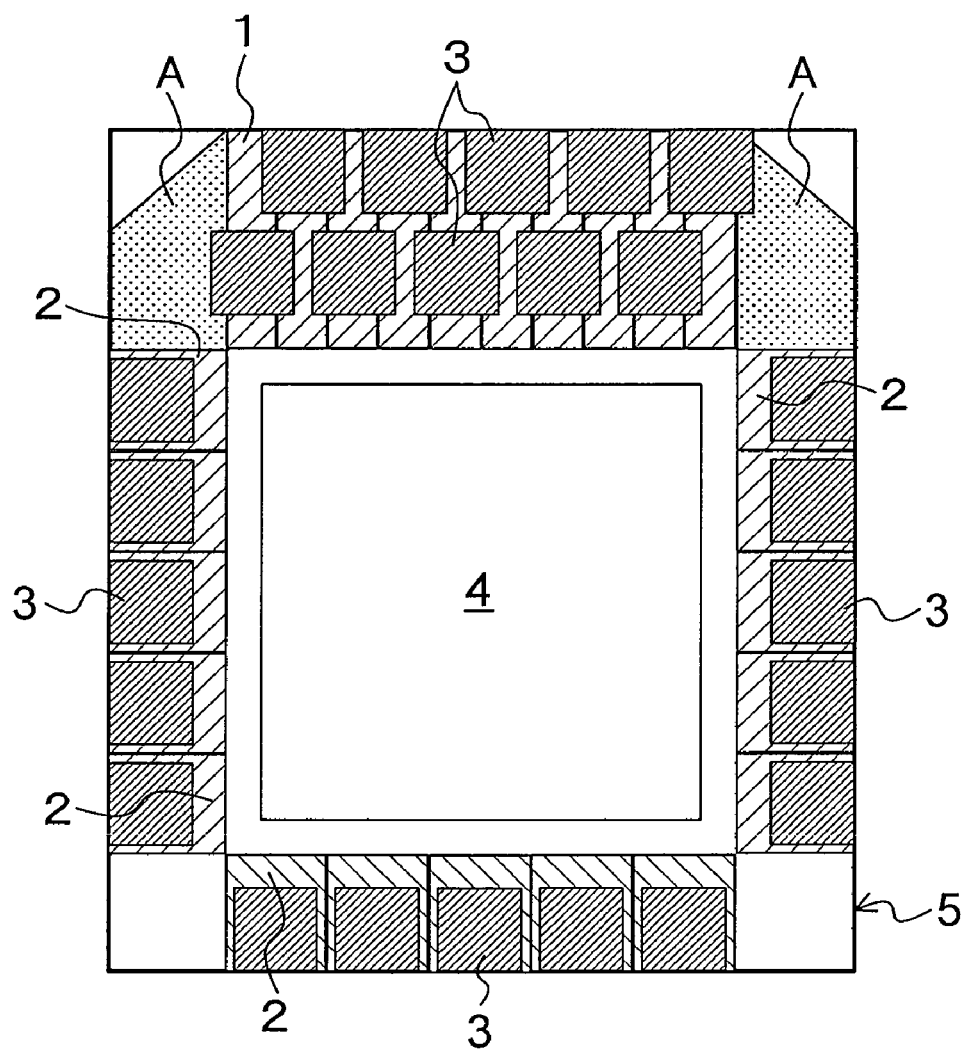
FIG. 16 shows a third modification of this semiconductor integrated circuit.
Figure 17:
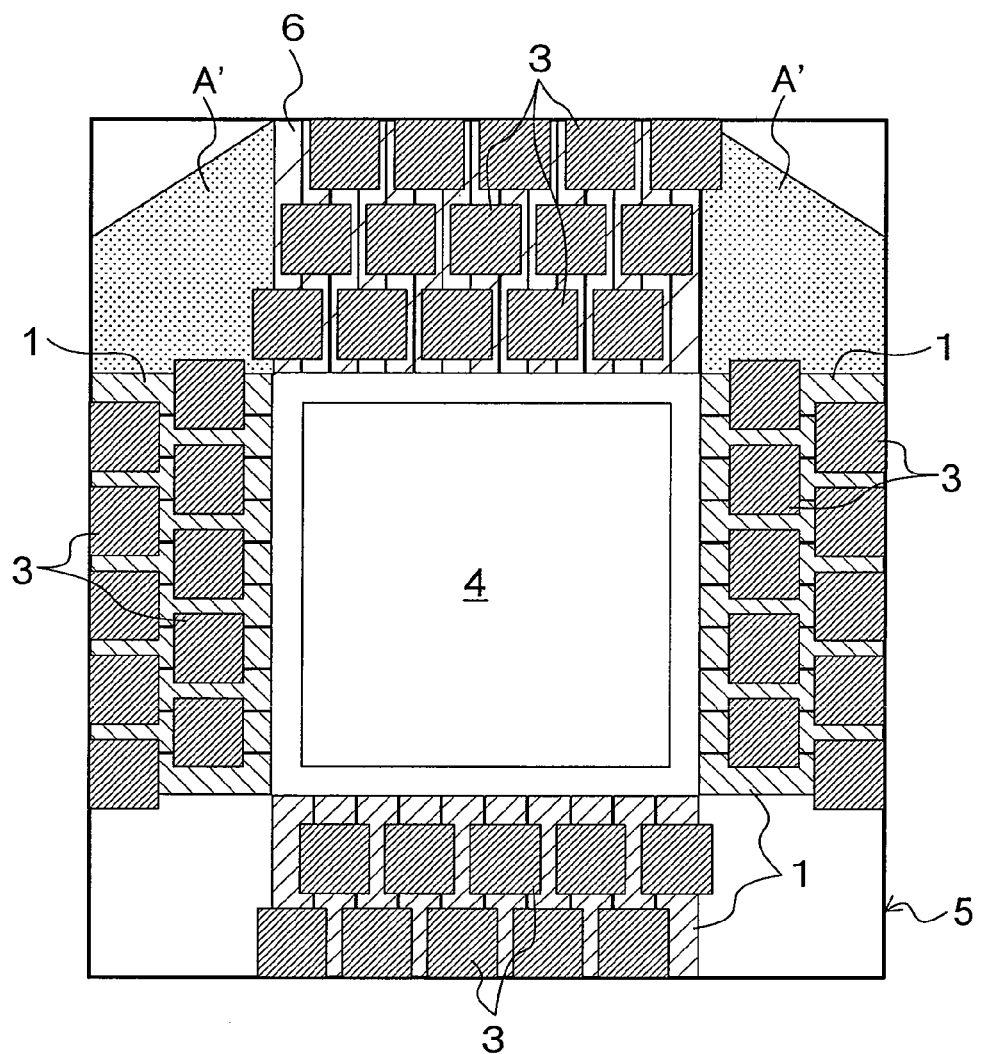
FIG. 17 shows a fourth modification of this semiconductor integrated circuit.
Figure 18:
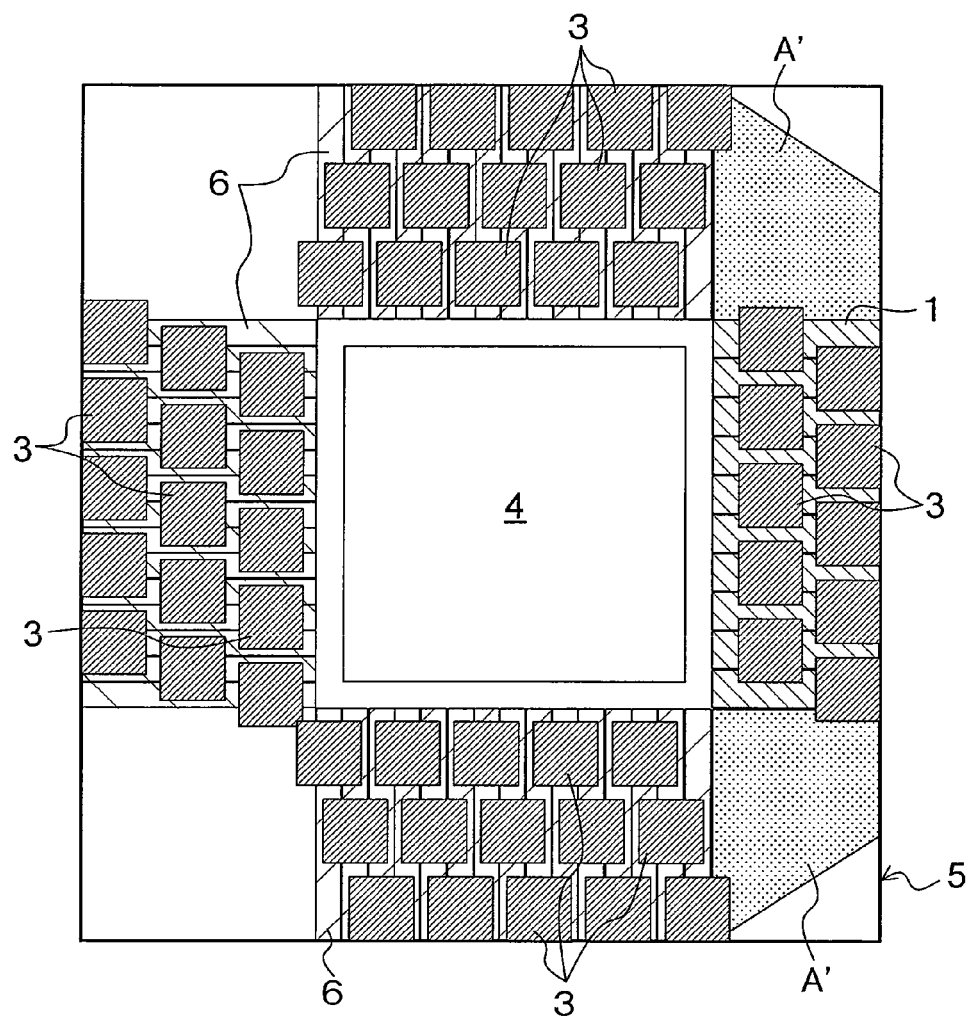
FIG. 18 shows a fifth modification of this semiconductor integrated circuit.

FIG. 16 shows another modification. In the semiconductor integrated circuit 5 in the figure, the one-pad I/O circuits 2 are arranged side by side along the two sides facing each other, the left side and the right side; the two-pad I/O circuits 1 are arranged side by side along the upper side; and the one-pad I/O circuits 2 are arranged side by side along the lower side. In this modification, the one-pad I/O circuit 2 are therefore adjacent to the two-pad I/O circuit 1 only in the corner portions at the upper left and at the upper right. The density of placement of the pads 3 in the corner portion can be reduced to the lowest among cases where two kinds of I/O circuit are arranged. FIG. 17 shows a semiconductor integrated circuit in which the one-pad I/O circuits 2 of the semiconductor integrated circuit of FIG. 16 are changed to the two-pad I/O circuits 1, and the two-pad I/O circuits 1 are changed to the three-pad I/O circuits 6. In the semiconductor integrated circuit of FIG. 18, the three-pad I/O circuits 6 are arranged side by side along the two sides facing each other, the upper side and the lower side; the two-pad I/O circuits 1 along the right side; and the three-pad I/O circuits 6 along the left side. In this modification, the two-pad I/O circuits 1 are therefore adjacent to the three-pad I/O circuits 6 in the both corner portions at the upper right and at the lower right. The density of placement of the pads 3 near the corner portions can be reduced.

Fourth Embodiment

Figure 19A:
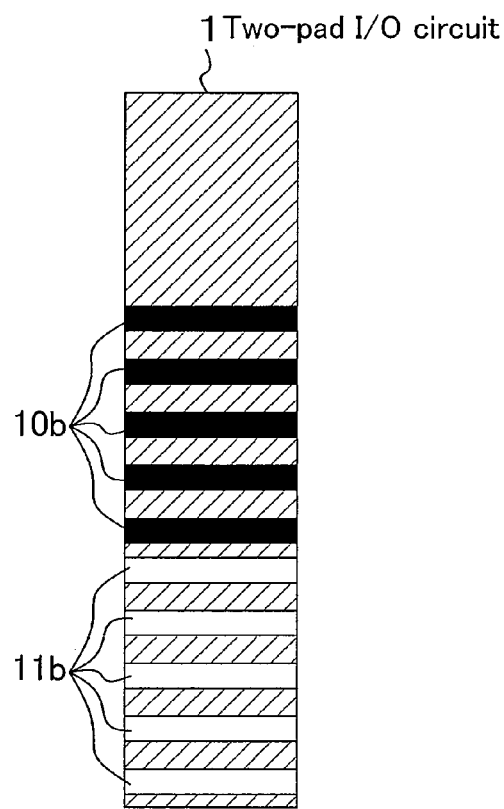
FIG. 19A shows a layout of power source wirings in a one-pad I/O circuit in a semiconductor integrated circuit of a fourth embodiment of the present invention.
Figure 19B:
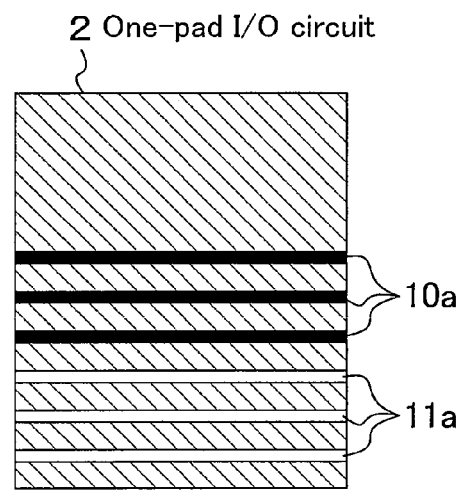
FIG. 19B shows a layout of power source wirings in a two-pad I/O circuit in the semiconductor integrated circuit.

FIGS. 19A and 19B show a fourth embodiment of the present invention.

The figures show the layouts of power source wirings arranged inside the one-pad I/O circuits 2 and the two-pad I/O circuits 1 included in the aforementioned semiconductor integrated circuit of FIG. 1.

The one-pad I/O circuit 2 shown in FIG. 19B and the two-pad I/O circuit 1 shown in FIG. 19A are independent to each other, and therefore the shape and the number of the VDD power source wirings 10a and 10b and the VSS power source wirings 11a and 11b disposed inside the both I/O circuits may be mutually independently set. Accordingly, between the one-pad I/O circuit 2 and the two-pad I/O circuit 1, the number of VDD power source wirings 10a is independently set to three, and the number of VDD power source wirings 10b to five, and the wiring widths also differ from each other such that the width in the one-pad I/O circuit 2 is narrower.

Figure 20A:
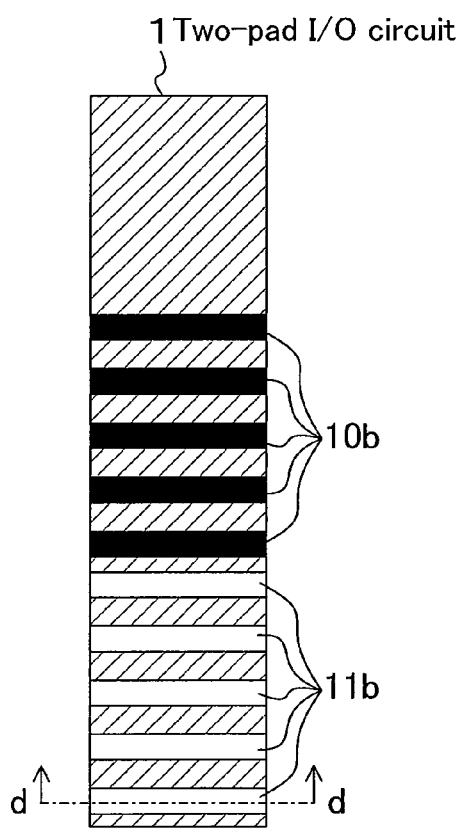
FIG. 20A shows another layout of power source wirings in a one-pad I/O circuit in a semiconductor integrated circuit of this embodiment.
Figure 20B:
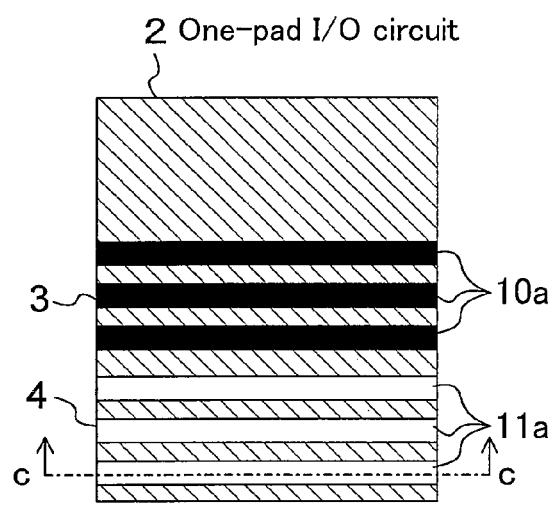
FIG. 20B shows another layout of power source wirings in a two-pad I/O circuit in this semiconductor integrated circuit.
Figure 20D:
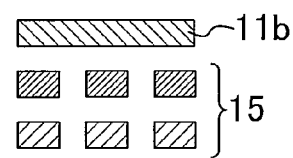
FIG. 20D is a sectional view taken along the line d-d in FIG. 20A.
Figure 20C:
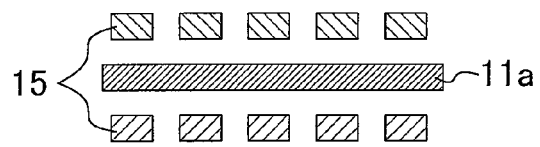
FIG. 20C is a sectional view taken along the line c-c in FIG. 20B.

FIGS. 20A and 20B show a modification of this embodiment. Regarding the one-pad I/O circuit 2 of FIG. 20B and the two-pad I/O circuit 1 of FIG. 20A, the VDD power source wirings 10a and the VSS power source wirings 11a are set to the same width, and the VDD power source wirings 10b and the VSS power source wirings 11b are also set to the same width. FIG. 20C are sectional views taken along the line c-c in FIG. 20B, and FIG. 20D are sectional views taken along the line d-d in FIG. 20A. As shown in FIG. 20C, the VDD power source wirings 10a and the VSS power source wirings 11a of the one-pad I/O circuit 2 are disposed in a second wiring layer and signal wirings 15 in the I/O circuit 2 are disposed in first and third wiring layers. As shown in FIG. 20D, on the other hand, the VDD power source wirings 10b and the VSS power source wirings 11b of the two-pad I/O circuit 1 are configured in the third wiring layer and the signal wirings 15 in the I/O circuit 2 are configured in the first and second wiring layers. Thus, it is possible in this modification that the wiring layer, in which power source wirings are placed, disposed inside the one-pad I/O circuit 2 differs from that disposed inside the two-pad I/O circuit 1.

FIGS. 21A to 21D show another modification of this embodiment. In the one-pad I/O circuit 1 in FIG. 21A, wirings 16 supplying a potential to internal circuit 4 (upward in the figure) are configured toward the pad 3 in the same wiring layer in which the pad 3 is configured. In the two-pad I/O circuit 1 in FIG. 21C, on the other hand, wirings 17 supplying a potential to the internal circuit 4 cannot be configured toward a pad 3a located outside (lower side in the figure) in the same wiring layer in which pad the 3a is configured because pads 3b and 3c adjacent to each other located inside (upper side in the figure) are obstructive. The wirings 17 are therefore configured through a plurality of vias 18 in a wiring layer that is one layer lower than the pads 3b and 3c as shown in FIG. 21D. As a result, in the one-pad I/O circuit 2, the wiring layer in which the wirings 17 for supplying a potential to the internal circuit 4 is configured in the two-pad I/O circuit 1 is free, and therefore a configuration is employed in which sub VDD power source wirings 10a' and sub VSS power source wirings 11a' for enhancing the aforementioned VDD power source wirings 10a and VSS power source wirings 11a are placed in this wiring layer, and both the wirings are connected through the vias 19.

Thus, in this modification, the power source wirings are configured in two wiring layers in the one-pad I/O circuit 2 and in one wiring layer in the two-pad I/O circuit 1 such that the one-pad I/O circuit 2 differs from the two-pad I/O circuit 1 in the number of wiring layers for configuration of power source wirings. Such a configuration allows the one-pad I/O circuit 2 and the two-pad I/O circuit 1 to be designed independently in individual circuits, and thus is employable.

Fifth Embodiment

Subsequently, a fifth embodiment of the present invention will be described.

FIGS. 22A and 22B show a configuration example in the case where this semiconductor integrated circuit is included in a multi-chip module.

In FIG. 22A, reference numeral 20 denotes a semiconductor chip that is constituted of a system large-scale integrated circuit (LSI) as this semiconductor integrated circuit. Reference numeral 21 denotes a semiconductor chip constituted of a memory chip as another semiconductor integrated circuit and an analog LSI, which mounts on the semiconductor chip 20 constituted of this semiconductor integrated circuit. Both these semiconductor chips constitute a multi-chip module, and the multi-chip module is assembled into a semiconductor package (System-in Package).

As shown in FIG. 22B, in the semiconductor chip 21 of another semiconductor integrated circuit, a plurality of one-pad I/O circuits 2 each having one pad 3 are arranged side by side along one side, as usual. In the semiconductor chip 20 of this semiconductor integrated circuit, on the other hand, if the configuration of connection to the pad 3 of the one-pad I/O circuit 2 in the semiconductor chip 21 of the foregoing another semiconductor integrated circuit is known in advance, the one-pad I/O circuits 2 are used as I/O circuits to be arranged side by side along one side. Considering the arrangement pitch of the one-pad I/O circuits 2 in the semiconductor chip 21 of the foregoing another semiconductor integrated circuit, the one-pad I/O circuits 2 in the semiconductor chip 20 are arranged at pitch substantially equal to this arrangement pitch to face the I/O circuits 2 in the semiconductor chip 21 of the foregoing another semiconductor integrated circuit. Each pair of the plurality of one-pad I/O circuits 2 of both the semiconductor chips 20 and 21 is connected by a chip-to-chip interconnect 25.

Figure 23:
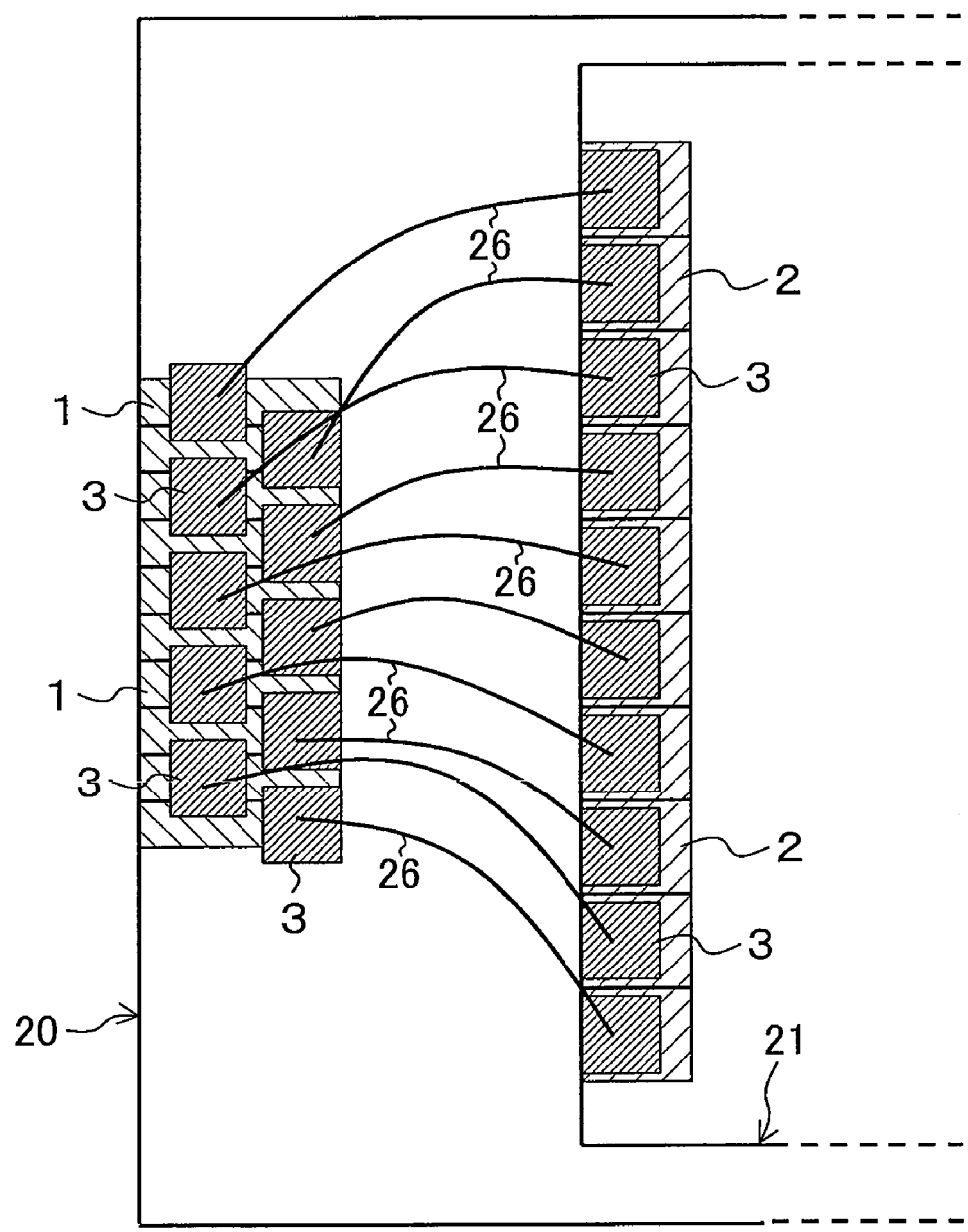
FIG. 23 shows the configuration of a multi-chip module to be compared with the multi-chip module of this embodiment.
Figure 24:
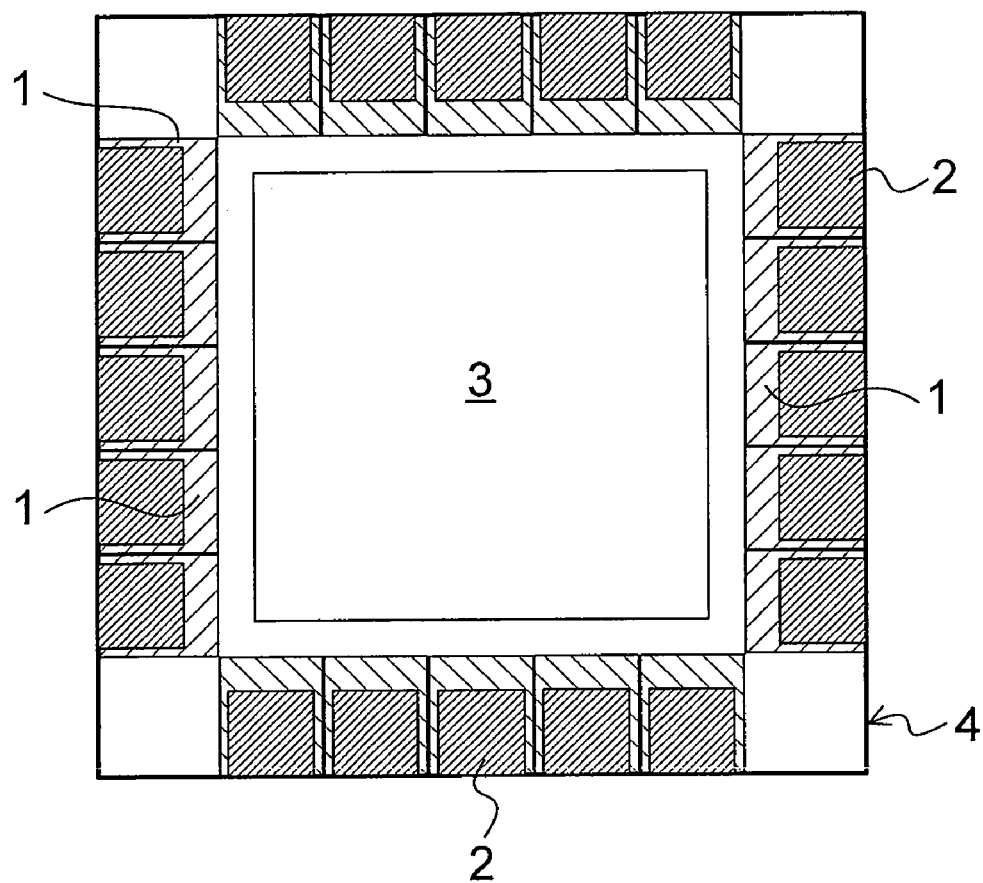
FIG. 24 shows a conventional semiconductor integrated circuit.
Figure 25:
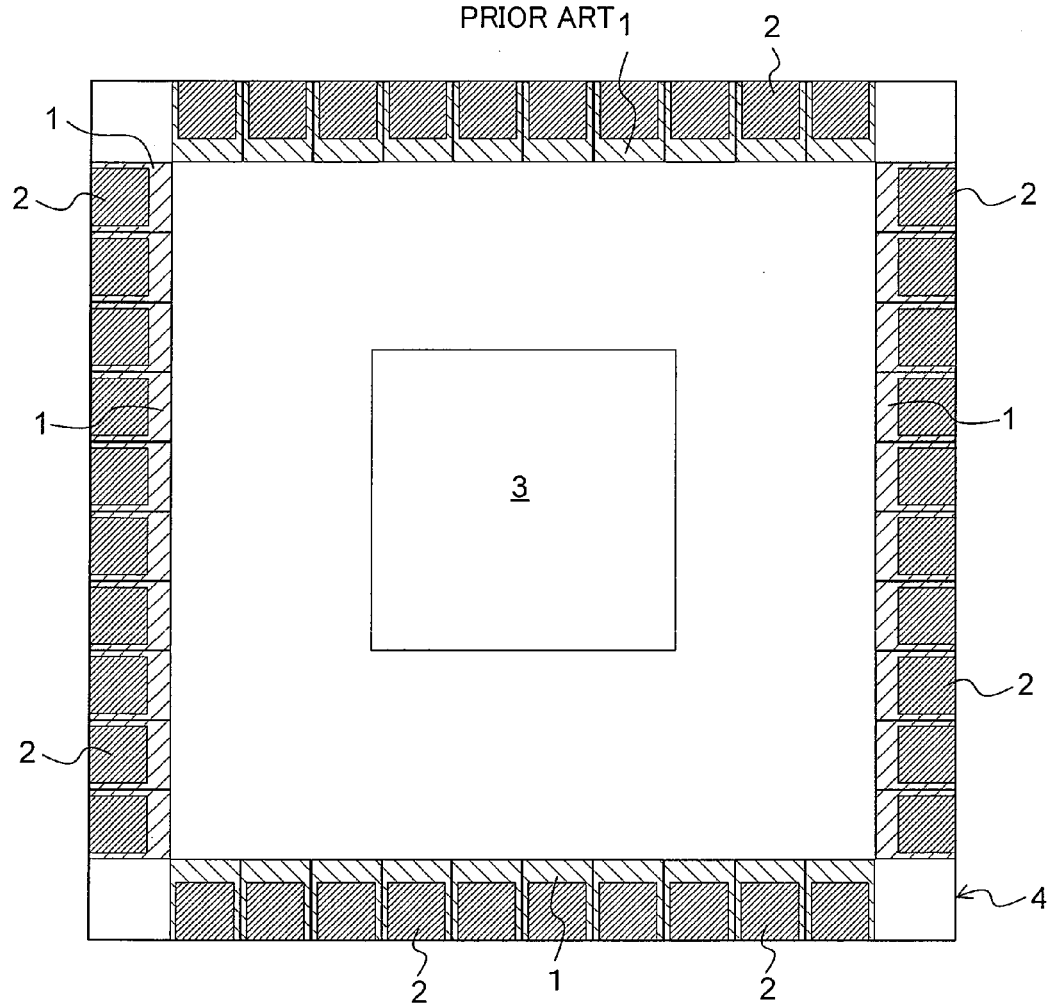
FIG. 25 shows a case where the number of pads required for the semiconductor integrated circuit increases.

Therefore, in this embodiment, the arrangement pitch of the one-pad I/O circuit 2 in this semiconductor integrated circuit is set such that the arrangement pitch is equal between the one-pad I/O circuits 2 of the both semiconductor chips 20 and 21. A plurality of chip-to-chip interconnects 25 have substantially the same and short length to thereby improve assembling efficiency. As a result, for example, if the two-pad I/O circuits 1 as the I/O circuits arranged along one side of the semiconductor chip 20 of this semiconductor integrated circuit are arranged for the plurality of one-pad I/O circuits 2 arranged along one side of the semiconductor chip 21 of the another semiconductor integrated circuit as shown in FIG. 23, the distance of a pair of pads, one of which is connected with the other, differs among pairs of pads such that the lengths of a plurality of chip-to-chip interconnects 26 differ from one another. Consequently, signal characteristics vary among pairs of pads. However, in this embodiment, even if the area reduction of the semiconductor integrated circuit is effective by employing the two-pad I/O circuits 1, the one-pad I/O circuits 2 with wide arrangement pitch are employed, at the sacrifice of area reduction to some extent, considering the arrangement pitch of the I/O circuits of the another semiconductor integrated circuit with which the I/O circuits of this semiconductor integrated circuit are connected. Therefore, variations in signal characteristics among pairs of pads can be suppressed by using the chip-to-chip interconnects 25 having equal and short lengths. High-speed interface characteristics can also be achieved to be effective, e.g., for high-speed dynamic random access memory (DRAM) of double-data-rate (DDR) mode.

Sixth Embodiment

Further, a sixth embodiment of the present invention will be described.

This embodiment is intended to cause I/O circuits that differ from each other in the number of pads to have the same electrical characteristics as the I/O functions, e.g., between a one-pad I/O circuit and a two-pad I/O circuit, and between a two-pad I/O circuit and a three-pad I/O circuit. Description will be given below with the case of a one-pad I/O circuit and a two-pad I/O circuit as an example.

Figure 27:
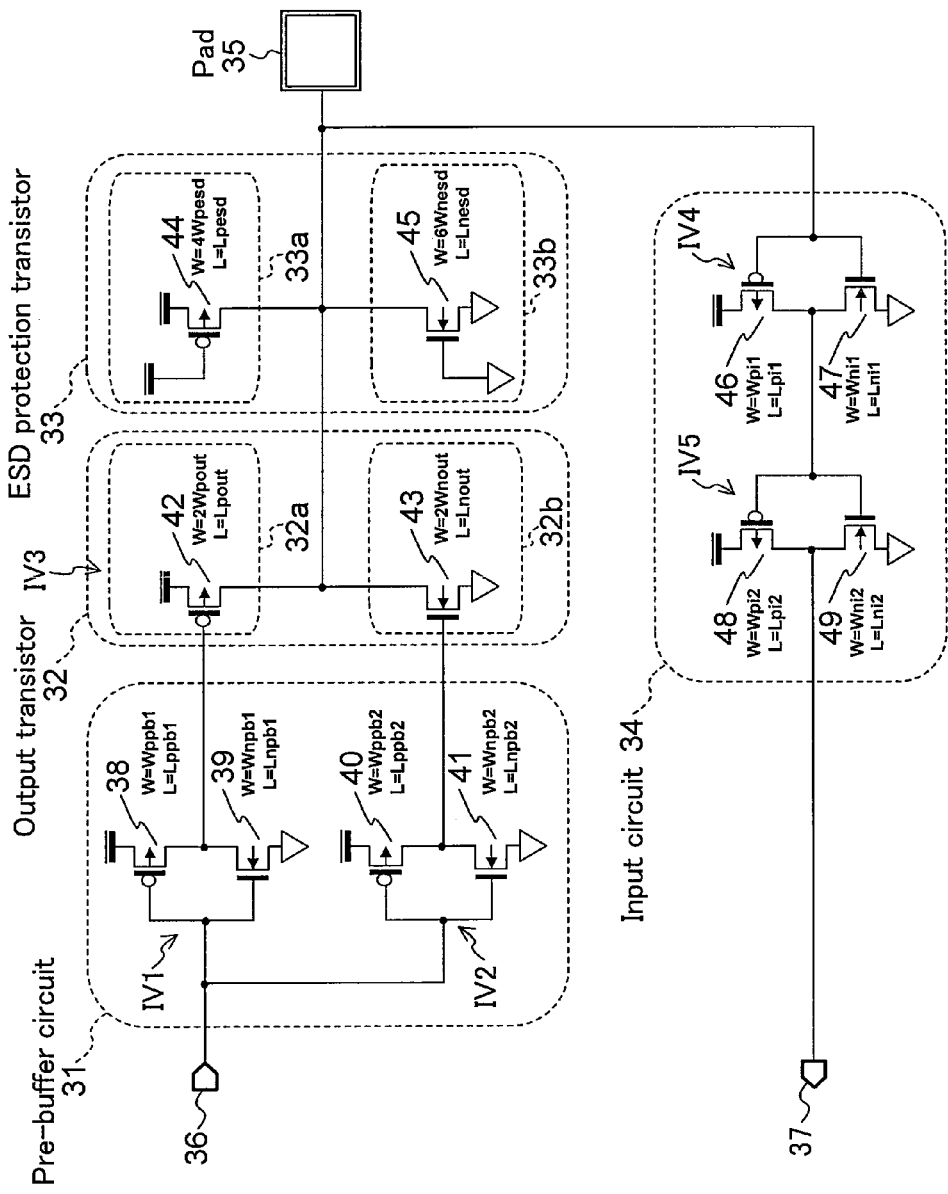
FIG. 27 shows an electrical circuit of an I/O circuit as a semiconductor integrated circuit of a sixth embodiment of the present invention.

FIG. 27 is an electric circuit diagram of an I/O circuit for one-pad or two pads. In the figure, reference numeral 35 denotes a pad arranged on the upper side of the I/O circuit; 36, an internal signal input terminal to which an internal signal from the internal circuit 4 shown in FIG. 1 is input; and 37, an internal signal output interface that outputs an internal signal to the internal circuit 4. An internal signal input to the internal signal input terminal 36 is transmitted through a pre-buffer circuit 31 and an output transistor 32 and further through an ESD protection transistor 33 to the pad 35, and is output from the pad 35 to the outside. The signal input to the pad 35 from the outside is transmitted through an input circuit 34 to the internal signal output terminal 37, and is output from the internal signal output terminal 37 to the internal circuit 4.

The foregoing pre-buffer circuit 31 includes a first inverter circuit IV1 having a p-type transistor 38 with a gate width W=Wppb1 and a gate length L=Lppb1 and an N-type transistor 39 with a gate width W=Wnpb1 and a gate length L=Lnpb1, and a second inverter circuit IV2 having a p-type transistor 40 with a gate width W=Wppb2 and a gate length L=Lppb2 and an N-type transistor 41 with a gate width W=Wnpb2 and a gate length L=Lnpb2, and the first inverter circuit IV1 and the second inverter circuit IV2 are connected in parallel to the internal signal input terminal 36.

The foregoing output transistor 32 includes a third inverter circuit IV3 having a P-type transistor 42 that receives an output signal of the first inverter circuit IV1 with a gate terminal and that has a gate width W=Wpout and a gate length L=Lpout, and an N-type transistor 43 that receives an output signal of the second inverter circuit IV2 with a gate terminal and that has a gate width W=Wnout and a gate length L=Lnout.

Further, the ESD protection transistor 33 includes a P-type transistor 44 in which a power supply voltage is continuously applied to a gate terminal and which has a gate width W=Wpesd and a gate length L=Lpesd, and an N-type transistor 45 in which a gate terminal is grounded and which has a gate width W=Wnesd and a gate length L=Lnesd, and the P-type transistor 44 and the N-type transistor 45 are connected in series between the power supply and the ground.

In addition, the foregoing input circuit 34 includes a fourth inverter circuit IV4 having a P-type transistor 46 with a gate width W=Wpi1 and a gate length L=Lpi1 and an N-type transistor 47 with a gate width W=Wni1 and a gate length L=Lni1, and a fifth inverter circuit IV5 having a P-type transistor 48 with a gate width W=Wpi2 and a gate length L=Lpi2 and an N-type transistor 49 with a gate width W=Wni2 and a gate length L=Lni2, and the fourth inverter circuit 1V4 and the fifth inverter circuit IV5 are connected in series to each other.

All the two transistors 42 and 43 of the foregoing output transistor 32 and the two transistors 44 and 45 of the foregoing ESD protection transistor 33 are ones each having a drain connected directly to the pad 35.

Figure 28:
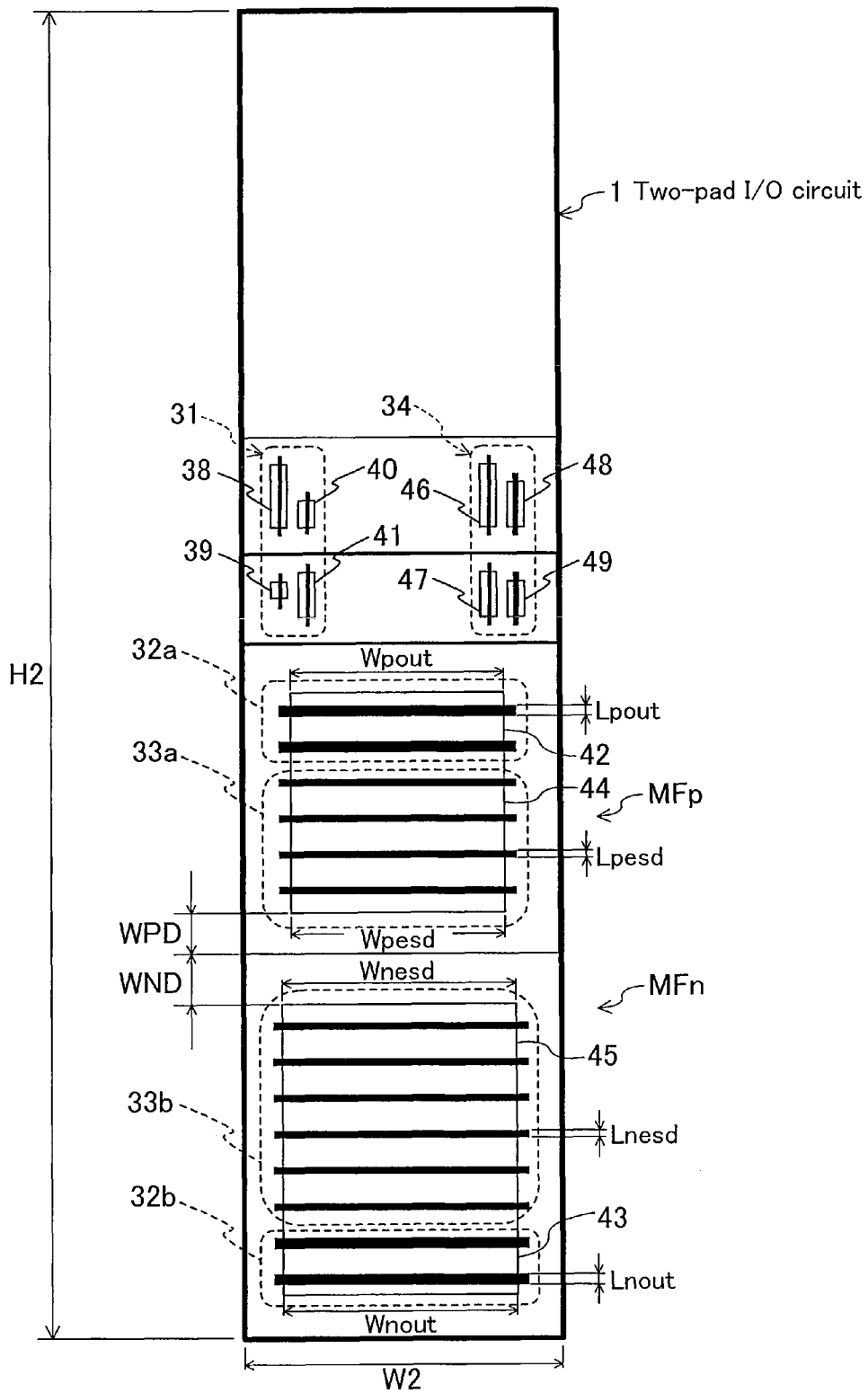
FIG. 28 shows a layout in the case where this I/O circuit is constituted of a two-pad I/O circuit.
Figure 29:
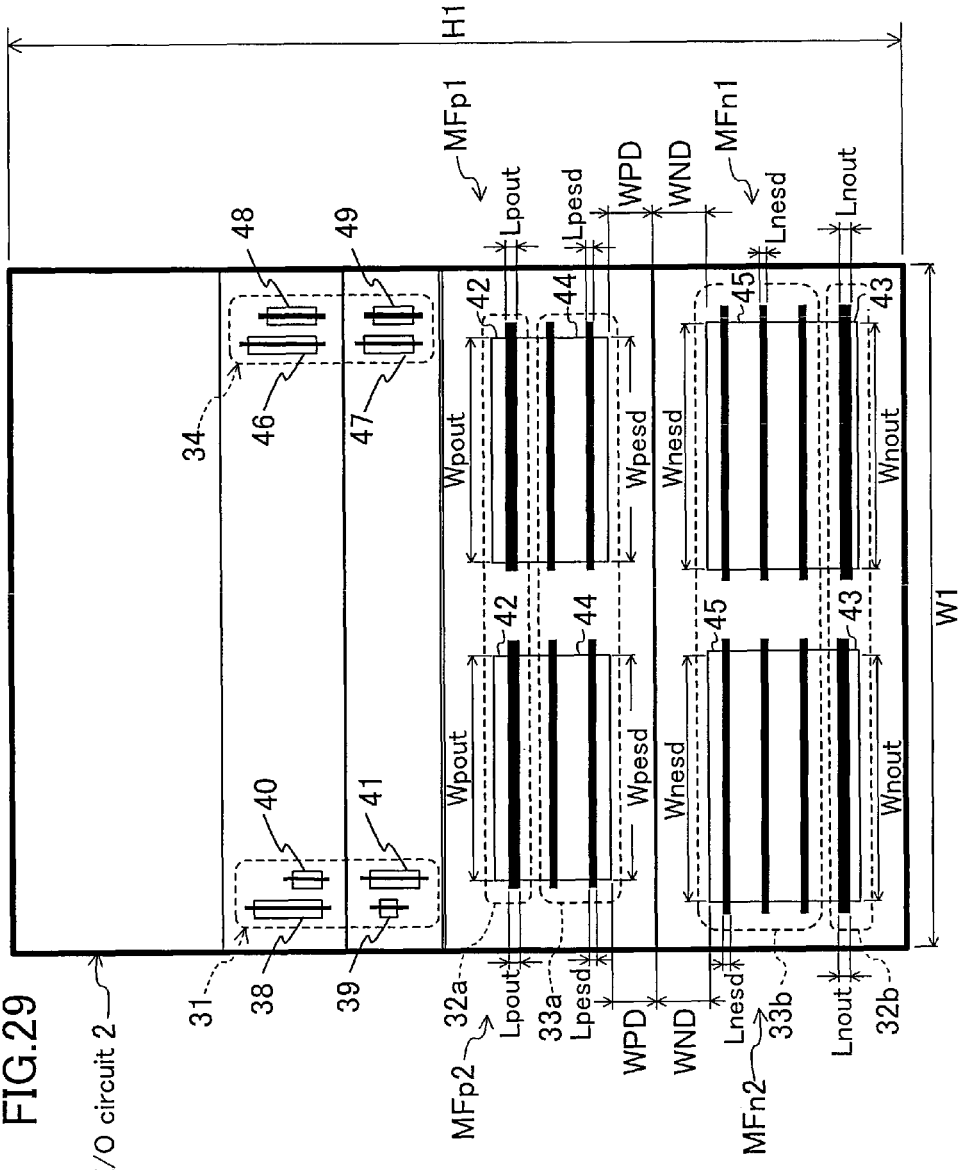
FIG. 29 shows a layout in the case where this I/O circuit is constituted of a one-pad pad I/O circuit.

FIG. 28 and FIG. 29 show layouts of a one-pad I/O circuit and a two-pad I/O circuit that realize electrical circuits of the I/O circuits shown in FIG. 27.

FIG. 28 shows a layout of the two-pad I/O circuit 1, and FIG. 29 shows a layout of the one-pad I/O circuit 2. In these figures, the width W=W1 and the height H=H1 in the one-pad I/O circuit 2, and the width W=W2 (W2<W1) and the height H=H2 (H2>H1) in the two-pad I/O circuit 1. For example, when the width is set to W1=2·W2, the height is set to H1=H2/2.

Regarding the foregoing one-pad I/O circuit 2 and the two-pad I/O circuit 1, the upper side in the figure corresponds to the side of the internal circuit 4 in FIG. 1, and the lower side in the figure corresponds to the side of outer edge of the semiconductor integrated circuit 5. In each of the I/O circuits 1 and 2, N-type transistor units 32b and 33b of the output transistor 32 and the ESD protection transistor 33 are formed on the lower side in the figure, and P-type transistor units 32a and 33a of the output transistor 32 and the ESD protection transistor 33 are formed in upper portions in the figure. The pre-buffer unit 31 and the input circuit 34 are formed in further upper portions.

Comparing the two-pad I/O circuit 1 shown in FIG. 28 with the one-pad I/O circuit 2 in FIG. 29, the gate widths W of the P-type transistors 42 each constituting part of the output transistor 32 are unified into W=2Wpout, and the gate widths W of the P-type transistors 44 each constituting part of the ESD protection transistor 33 are unified into W=4Wpesd. Accordingly, the total of gate widths of the P-type transistors 42 and 44 (that is, P-type transistors each having a drain connected directly to the pad 35) are unified into (2Wpout+4Wpesd) between the one-pad I/O circuit 2 and the two-pad I/O circuit 1.

Similarly, comparing the two-pad I/O circuit 1 with the one-pad I/O circuit 2, the gate widths W of the N-type transistors 43 each constituting part of the output transistor 32 are unified into W=2Wnout, and the gate widths W of the N-type transistors 45 each constituting part of the ESD protection transistor 33 are unified into W=6Wnesd. Accordingly, the total of the gate widths of the N-type transistors 43 and 45 (that is, N-type transistors each having a drain connected directly to the pad 35) are unified into (2Wnout+6Wnesd) between the one-pad I/O circuit 2 and the two-pad I/O circuit 1.

As a result, the totals of the gate widths of the P-type and N-type transistors 42, 43, 44, and 45 each having a drain connected directly to the pad 35, as a whole, are unified into (2Wpout+4Wpesd+2Wnout+6Wnesd) between the one-pad I/O circuit 2 and the two-pad I/O circuit 1.

Further, in the two-pad I/O circuit 1 in FIG. 28, the P-type transistors 42 and 44 each having a drain connected directly to the pad 35, as a whole, are formed in a multifinger structure MFp where six gate electrodes (two for the P-type transistor 42 and four for the P-type transistor 44) are disposed at predetermined intervals in one diffusion region, while the N-type transistors 43 and 45 each having a drain connected directly to the pad 35, as a whole, are formed in a multifinger structure MFn where eight gate electrodes (two for the N-type transistor 43 and six for the N-type transistor 45) are disposed at predetermined intervals in one diffusion region.

On the other hand, in the one-pad I/O circuit 2 in FIG. 29, the P-type transistors 42 and 44 each having a drain connected directly to the pad 35, as a whole, are formed in two multifinger structures MFp1 and MFp2, arranged side by side in a width direction of W1, where three gate electrodes (one for the P-type transistor 42 and two for the P-type transistor 44) are disposed at predetermined intervals in one diffusion region, while the N-type transistors 43 and 45 each having a drain connected directly to the pad 35, as a whole, are formed in two multifinger structures MFn1 and MFn2, arranged side by side in a width direction of W1, where four gate electrodes (one for the N-type transistor 43 and three for the N-type transistor 45) are disposed at predetermined intervals in one diffusion region.

In the two-pad I/O circuit 1 and the one-pad I/O circuit 2, the gate widths W of three multifinger structures MFp, MFp1, and MFp2 forming P-type transistors are equally set such that all the gate widths are unified into Wpout(=Wpesd). Similarly, the gate widths W of three multifinger structures MFn, MFn1, and MFn2 forming N-type transistors are equally set such that all the gate widths are unified into Wnout(=Wnesd).

Between the two-pad I/O circuit 1 and the one-pad I/O circuit 2, as apparent from comparison of FIG. 28 with FIG. 29, the P-type transistors 42 that realize the same function of the P-type transistor in the output transistor 32 are set to have the same gate length L=Lpout and the same gate width W=Wpout, while the N-type transistors 43 that realize the same function of the N-type transistor in the output transistor 32 are set to have the same gate length L=Lnout and the same gate width W=Wnout.

Similarly, between the one-pad I/O circuit 2 and the two-pad I/O circuit 1, as apparent from comparison of FIG. 28 with FIG. 29, the P-type transistors 44 that realize the same function of the P-type transistor in the ESD protection transistor 33 are set to have the same gate length L=Lpesd and the same gate width W=Wpesd, while the N-type transistors 45 that realize the same function of the N-type transistor in the ESD protection transistor 33 are set to have the same gate length L=Lnesd and the same gate width W=Wnesd.

Further, in the aforementioned pre-buffer 31 and the input circuit 34, transistors that realize the same function between the two-pad I/O circuit 1 and the one-pad I/O circuit 2 are set to have the same gate length and the same gate width. Specifically, in the pre-buffers 31 of the one-pad I/O circuit 2 and the two-pad I/O circuit 1, the P-type transistors 38 are set to have the same gate length L=Lppb1 and the same gate width W=Wppb1, the N-type transistors 39 are set to have the same gate length L=Lnpb1 and the same gate width W=Wnpb1, the P-type transistors 40 are set to have the same gate length L=Lppb2 and the same gate width W=Wppb2, and the N-type transistors 41 are set to have the same gate length L=Lnpb2 and the gate width W=Wnpb2. Similarly, in the input circuits 34 of the one-pad I/O circuit 2 and the two-pad I/O circuit 1, the P-type transistors 46 are set to have the same gate length L=Lpi1 and the same gate width W=Wpi1, the N-type transistors 47 are set to have the same gate length L=Lni1 and the same gate width W=Wni1, the P-type transistors 48 are set to have the same gate length L=Lpi2 and the same gate width W=Wpi2, and the N-type transistors 49 are set to have the same gate length L=Lni2 and the gate width W=Wni2.

In addition, in the two-pad I/O circuit 1 in FIG. 28, the distance Dp from a well boundary of a P-type transistor and a N-type transistor to the diffusion region in the multifinger structure MFp of the P-type transistor is set to Dp=WPD, while the distance Dn from the well boundary to the diffusion region in the multifinger structure MFn of the N-type transistor is set to Dn=WND. In correspondence to this, in the one-pad I/O circuit 2 in FIG. 29, the distance Dp from the well boundary of the P-type transistor and the N-type transistor to the diffusion region in each of the multifinger structures MFp1 and MFp2 of the P-type transistor is set to Dp=WPD, while the distance Dn from the well boundary to the diffusion region in each of the multifinger structures MFn1 and MFn2 of the N-type transistor is set to Dn=WND.

Thus, in this embodiment, the two-pad I/O circuit 1 and the one-pad I/O circuit 2 have the same electrical characteristics when the I/O circuits 1 and 2 are mixedly integrated into one semiconductor integrated circuit 5. Therefore, which of the two-pad I/O circuit 1 and the one-pad I/O circuit 2 to be integrated can be determined considering only the chip area of the semiconductor integrated circuit 5. Further, if I/O circuits that differ from each other in the number of pads have electrical characteristics different from each other, there is a disadvantage that, e.g., a one-pad I/O circuit cannot be connected to a specific signal terminal. In such a case, however, the arrangement position of the specific signal terminal needs not to be interchanged with that of another signal terminal that can be connected to the I/O circuit for one pad in this embodiment.

What is claimed is:

1. A semiconductor integrated circuit, comprising:
an internal circuit;
a plurality of input/output (I/O) circuits that are arranged side by side outside the internal circuit, that output a signal of the internal circuit to outside or input a signal of outside to the internal circuit, and on which pads are arrangeable; and a protection circuit, the plurality of I/O circuits including at least two kinds of I/O circuit differing in height in a direction toward the internal circuit, the at least two kinds of I/O circuit including:

an n-pad I/O circuit on which the n-pads (n being an integer equal to or larger than one) are arranged in a direction toward the internal circuit; and an m-pad I/O circuit on which the m-pads (m being an integer larger than n) are arranged in a direction toward the internal circuit, wherein each of the n-pad I/O circuit and the m-pad I/O circuit includes power source wirings extending in a direction of arrangement of the I/O circuits, and at least one of the power source wirings is positioned at a different height from an outer edge between the n-pad I/O circuit and the m-pad I/O circuit, between the n-pad I/O circuit and the m-pad I/O circuit arranged side by side, a power source wiring migration area is formed in which power source wirings for connecting the power source wirings of the n-pad I/O circuit with the power source wirings of the m-pad I/O circuit are formed, and the protection circuit is disposed directly below the power source wirings of one of the plurality of I/O circuits.

2. The semiconductor integrated circuit according to claim 1, wherein the protection circuit is a protection circuit for electrostatic discharge.

3. The semiconductor integrated circuit according to claim 1, wherein the protection circuit is provided in the input/output (I/O) circuit.

4. The semiconductor integrated circuit according to claim 1, wherein the power source wirings include:
first power source wirings; and
second power source wirings having a voltage different from that of the first power source wirings.

5. The semiconductor integrated circuit according to claim 4, wherein:
the protection circuit includes first and second protection circuits,
the first protection circuit is provided directly below the first power source wirings; and
the second protection circuit is provided directly below the second power source wirings.

6. The semiconductor integrated circuit according to claim 4, wherein the n is 2 and the m is 3.

7. A semiconductor integrated circuit, comprising:
an internal circuit;
a plurality of input/output (I/O) circuits that are arranged side by side outside the internal circuit, that output a signal of the internal circuit to outside or input a signal of outside to the internal circuit, and on which pads are arrangeable; and
a protection circuit,
the plurality of I/O circuits including at least two kinds of I/O circuit differing in height in a direction toward the internal circuit, the at least two kinds of I/O circuit including:
an n-pad I/O circuit on which the n-pads (n being an integer equal to or larger than one) are arranged in a direction toward the internal circuit, and
an m-pad I/O circuit on which the m-pads (m being an integer larger than n) are arranged in a direction toward the internal circuit, wherein each of the n-pad I/O circuit and the m-pad I/O circuit includes power source wirings extending in a direction of arrangement of the I/O circuits, and at least one of the power source wirings is positioned at a different height from an outer edge between the n-pad I/O circuit and the m-pad I/O circuit, the n-pad I/O circuit and the m-pad I/O circuit arranged side by side adjacent to each other are positioned apart from each other by a predetermined distance, and the protection circuit is disposed between the n-pad I/O circuit and the m-pad I/O circuit arranged side by side adjacent to each other.

8. The semiconductor integrated circuit according to claim 7, wherein the protection circuit is a protection circuit for electrostatic discharge.

9. The semiconductor integrated circuit according to claim 7, wherein the protection circuit is a protection circuit for electrostatic discharge between the n-pad I/O circuit and the m-pad I/O circuit arranged side by side adjacent to each other.

10. The semiconductor integrated circuit according to claim 7, wherein the power source wirings include:
first power source wirings; and
second power source wirings having a voltage different from that of the first power source wirings.

11. The semiconductor integrated circuit according to claim 7, wherein the power source wirings included in the n-pad I/O circuit and the power source wirings included in the m-pad I/O circuit differ from each other in number.

12. The semiconductor integrated circuit according to claim 7, wherein the power source wirings included in the n-pad I/O circuit and the power source wirings included in the m-pad I/O circuit differ from each other in wiring width.

13. The semiconductor integrated circuit according to claim 7, wherein a wiring layer in which the power source wirings included in the n-pad I/O circuit are formed and a wiring layer in which the power source wirings included in the m-pad I/O circuit are formed differ from each other.

14. The semiconductor integrated circuit according to claim 7, wherein a wiring layer in which the power source wirings included in the n-pad I/O circuit are formed and a wiring layer in which the power source wirings included in the m-pad I/O circuit are formed differ from each other in number.

15. The semiconductor integrated circuit according to claim 7, wherein the n is 2 and the m is 3.

16. The semiconductor integrated circuit according to claim 10, wherein the protection circuit is a protection circuit for electrostatic discharge between the first power source wirings.

17. A semiconductor integrated circuit, comprising:
an internal circuit; and
a plurality of input/output (I/O) circuits that are arranged side by side outside the internal circuit, that output a signal of the internal circuit to outside or input a signal of outside to the internal circuit, and on which pads are arrangeable,
the plurality of I/O circuits including at least two kinds of I/O circuit differing in height in a direction toward the internal circuit, the at least two kinds of I/O circuit including:
an n-pad I/O circuit on which the n-pads (n being an integer equal to or larger than one) are arranged in a direction toward the internal circuit; and
an m-pad I/O circuit on which the m-pads (m being an integer larger than n) are arranged in a direction toward the internal circuit, wherein each of the n-pad I/O circuit and the m-pad I/O circuit includes power source wirings extending in a direction of arrangement of the I/O circuits, and at least one of the power source wirings is positioned at a different height from an outer edge between the n-pad I/O circuit and the m-pad I/O circuit, between the n-pad I/O circuit and the m-pad I/O circuit arranged side by side, a power source wiring migration area is formed in which power source wirings for connecting the power source wirings of the n-pad I/O circuit with the power source wirings of the m-pad I/O circuit are formed, and a part of a specific pad of the pads overlaps with the power source wiring migration area when viewed in plan.

18. The semiconductor integrated circuit according to claim 17, wherein:
   the n-pad I/O circuit and the m-pad I/O circuit are positioned in ends of two sides that form a corner portion of the semiconductor integrated circuit; and
   the power source wiring migration area is formed in the corner portion.

19. The semiconductor integrated circuit according to claim 17, wherein the specific pad is the first pad disposed in the m-pad I/O circuit.

20. The semiconductor integrated circuit according to claim 17, wherein the specific pad is the $m^{th}$ pad disposed in the m-pad I/O circuit.

* * * * *